(12) United States Patent
Pitner et al.

(10) Patent No.: US 11,177,002 B1
(45) Date of Patent: Nov. 16, 2021

(54) PROGRAMMING MEMORY CELLS USING ENCODED TLC-FINE

(71) Applicant: SanDisk Technologies LLC, Addison, TX (US)

(72) Inventors: Xue Pitner, San Jose, CA (US); Ravi Kumar, Redwood City, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/916,285

(22) Filed: Jun. 30, 2020

(51) Int. Cl.
| | |
|---|---|
| *G11C 16/10* | (2006.01) |
| *G11C 16/26* | (2006.01) |
| *G11C 16/08* | (2006.01) |
| *G06F 12/02* | (2006.01) |
| *G06F 12/0882* | (2016.01) |
| *G11C 29/42* | (2006.01) |

(52) U.S. Cl.
CPC .......... *G11C 16/10* (2013.01); *G06F 12/0246* (2013.01); *G06F 12/0882* (2013.01); *G11C 16/08* (2013.01); *G11C 16/26* (2013.01); *G11C 29/42* (2013.01); *G11C 2211/561* (2013.01)

(58) Field of Classification Search
CPC ......... G11C 16/10; G11C 29/42; G11C 16/26; G11C 16/08; G11C 2211/561; G06F 12/0882; G06F 12/0246
See application file for complete search history.

(56) References Cited

U.S. PATENT DOCUMENTS

2013/0318419 A1* 11/2013 Seol .................... H03M 13/251
714/773

* cited by examiner

*Primary Examiner* — Jay W. Radke
(74) *Attorney, Agent, or Firm* — Dickinson Wright PLLC; Steven Hurles

(57) ABSTRACT

A storage device including control circuitry, communicatively coupled to a non-volatile memory, configured to receive a parity bit that has been stored using a data structure, and to receive a first subset of host data that includes block data relating to a set of memory cells. The control circuitry may be configured to perform a read operation to identify a second subset of host data that includes additional block data relating to the set of memory cells. The control circuitry may be configured to decode the second subset of host data using the parity bit. The control circuitry may be configured to perform a write operation to write the block data to at least one or more memory cells that are part of the set of memory cells.

20 Claims, 18 Drawing Sheets

PROGRAMMING MEMORY CELLS USING ENCODED TLC-FINE

BACKGROUND

The present technology relates to the operation of memory devices.

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), an electrically erasable programmable read-only memory (EEPROM), a flash memory, and/or the like. In an EEPROM or flash NAND array architecture, memory cells may be arranged in a matrix of rows and columns, such that gates of each memory cell are coupled by rows to word lines. The memory cells may be arranged together in strings such that memory cells in a given string are coupled together in series, from source to drain, between a common source line and a common bit line.

SUMMARY

One aspect of the present invention is related to a storage device that includes control circuitry, communicatively coupled to a non-volatile memory. The control circuitry may be configured to receive a parity bit that has been stored using a data structure, and to receive a first subset of host data that includes block data relating to a set of memory cells. The control circuitry may be configured to perform a read operation to identify a second subset of host data that includes additional block data relating to the set of memory cells. The control circuitry may be configured to decode the second subset of host data using the parity bit. The control circuitry may be configured to perform a write operation to write the block data to at least one or more memory cells that are part of the set of memory cells.

Another aspect of the present invention is related to a method of performing a programming operation to program a set of memory cells, the method comprising receiving a parity bit that has been stored using a data structure. The method further comprises receiving a first subset of host data that includes block data relating to the set of memory cells. The method further comprises performing a read operation to identify a second subset of host data that includes additional block data relating to the set of memory cells. The method further comprises decoding the second subset of host data using the parity bit. The method further comprises performing a write operation to write the block data to at least one or more memory cells that are part of the set of memory cells.

Yet another aspect of the present invention is related to a storage device comprising a non-volatile memory and control circuitry. The control circuitry may be communicatively coupled to the non-volatile memory. The control circuitry may be for programming a set of memory cells. The control circuitry may be configured to receive a parity bit that has been stored using a data structure. The control circuitry may be further configured to receive a first subset of host data that includes block data for a top page, wherein the block data relating to the set of memory cells. The control circuitry may be further configured to perform a read operation to identify a second subset of host data that includes three other pages of additional block data relating to the set of memory cells. The control circuitry may be further configured to decode the second subset of host data using the parity bit. The control circuitry may be further configured to perform a write operation to write the top page of block data and the three other pages of the additional block data that has been decoded to at least one or more memory cells that are part of the set of memory cells.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1A:
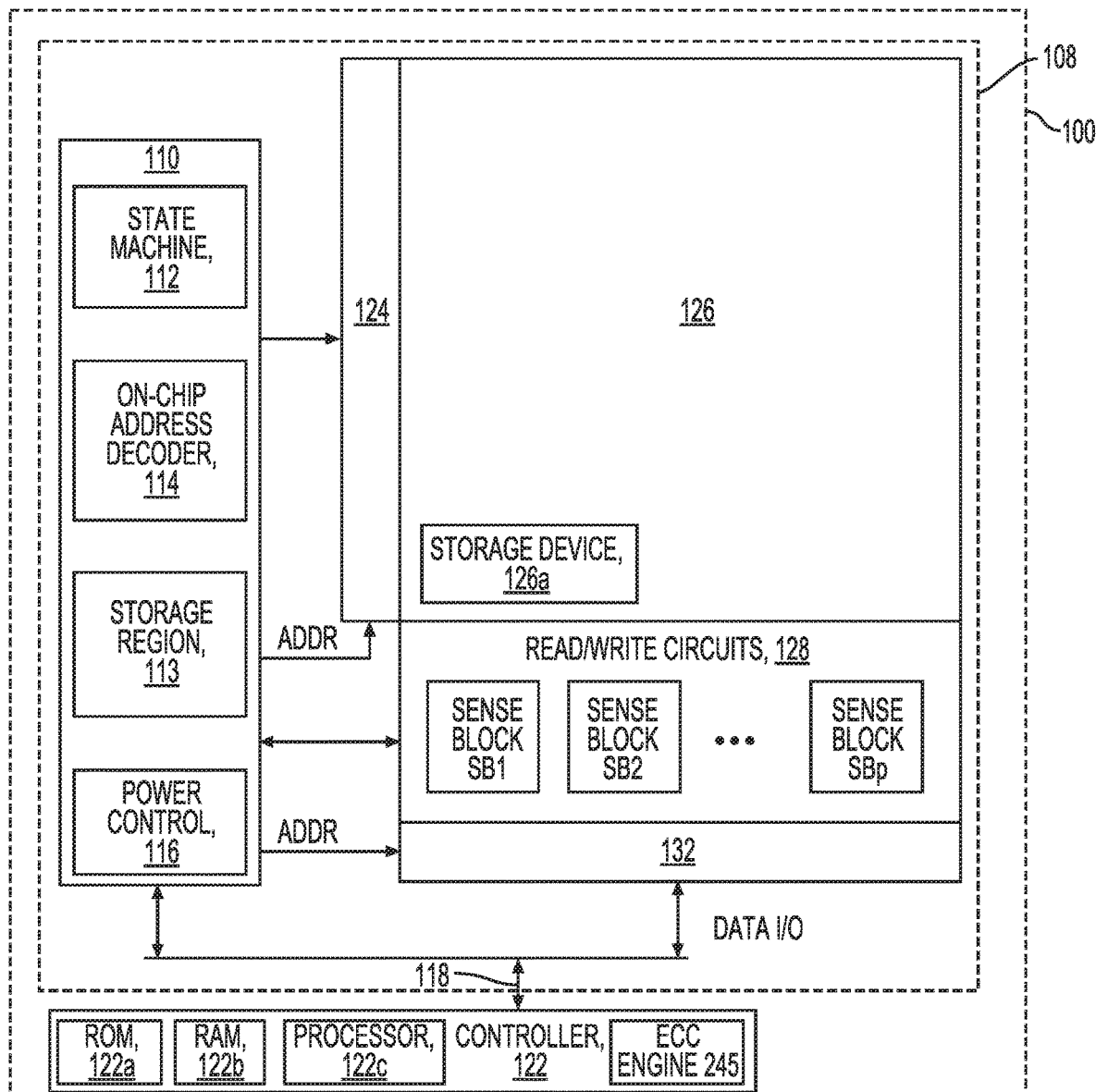
FIG. 1A illustrates a block diagram of an example memory device.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

A program-verify operation for a set of memory cells typically involves applying a series of program voltages to the memory cells after the memory cells are provided in an erased data state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it may be locked out from further programming while programming continues for other memory cells in subsequent program loops. The program-verify operation may be a multistep program-verify operation, a full sequence or one-step program-verify operation, or another type of program-verify operation.

Each memory cell may be associated with a data state according to write data in a program command. A memory cell may be in an erased data state (referred to herein as an erased data state) or may be programmed to a programmed data state (referred to herein as a programmed data state) that is different from the erased data state. For example, in a two-bit per cell memory device, there are four data states including the erased data state and three programmed data states referred to as the A, B and C data states (see FIG. 9). In a three-bit per cell memory device, there are eight data states including the erased data state and seven programmed data states referred to as the A, B, C, D, E, F and G data states (see FIG. 10). In a four-bit per cell memory device, there are sixteen data states including the erased data state and fifteen programmed data states referred to as the Er, A, B, C, D, E, F, G, H, I, J, K, L, M, N, and O, data states. These may also be referred to numerically, as data states 0, 1, 2, 3, 4, 5, 6, 7, 8, 9, 10, 11, 12, 13, 14, and 15, respectively.

When a program command is issued, the write data is stored in latches associated with the memory cells. During programming, the latches of a memory cell may be read to determine the data state to which the cell is to be programmed. Each programmed data state is associated with a verify voltage such that a memory cell with a given data state is considered to have completed programming when a read (sense) operation determines its threshold voltage (Vth) is above the associated verify voltage. A read (sense) operation may determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

In some situations, such as when NAND flash memories are programmed, specialized write methods have been applied to reduce program disturbances. In these situations, write data is written to a NAND memory by a multi-step programming operation including multiple of transfers of the same write data to the NAND memory.

One conventional solution involves storing four pages of block data using a single-level cell (SLC) memory cache and transferring the four pages of block data four separate times between various NAND components. For example, the conventional solution may involve transferring a first set of write data for multiple pages to a NAND memory, and writing the first set of write data to a first logical page (e.g., a memory cell may have four logical pages). Additionally, the conventional solution may be repeated for other logical pages. In this case, the first set of write data for the other pages is again transferred to the NAND memory, and the first set of write data is written to the other pages. However, implementing a programming operation that utilizes this many transfers increases bus traffic and greatly reduces system performance.

Another conventional method does not require storing and transferring four pages of block data using the SLC cache. In this method, two pages of block data are written to an MLC cache during a first stage of the operation. During a second stage, the two pages are read back and another two pages are to be used for a Fine portion of the operation. Consequently, there is no need for an SLC cache and the four pages of block data are provided to the NAND memory only one time throughout the two stages. However, this method requires a large internal data load (IDL) read margin and has a small final threshold voltage distribution (Vth) margin (relative to the first conventional programming operation described above) based on a large Vth differential between the first and second stage.

Another conventional method involves transmitting the four pages of block data to the NAND memory during a first stage, generating a parity bit capable of distinguishing between odd and even data states during the first stage, and storing the parity bit using the SLC cache. During the second stage, the four pages of block data (i.e., Foggy data) are read (e.g., without having to store the data in the SLC cache) and the parity bit is used to decode the data. However, this method requires that data state n and data state n+2 have no overlapping bits in order for the data to be read without error. This may be especially difficult to achieve after data retention (DR) procedures have been implemented for open block memory cells. In yet another conventional method, three pages of block data is written during a first stage. During a second stage, three pages of block data is read back and a fourth page is used for the fine portion of the operation. However, this approach requires a specific coding scheme (e.g., a 1-2-6-6 coding scheme, a 1-2-4-8 coding scheme, etc.) that has a large quantity of unbalanced data states on pages, thereby causing a large imbalance in failure bit counts (FBCs) on pages.

Some embodiments described herein may include systems and/or methods for programming a set of memory cells using a TCL-Fine programming operation. For example, during a first stage of the programming operation, three pages of block data is written to the memory cells to program the memory cells to eight data states (e.g., out of sixteen available data states present in QLCs). Concurrent with the first stage, a parity bit is generated and made accessible to a control circuitry associated with a NAND memory structure. The parity bit may be stored using SLC cache. During the second stage, the control circuitry (e.g., using a decoder) may have the data states from the first stage read back and may decode the data states by using the parity bit to distinguish between odd and even data states (sometimes referred to as n and n+1 data states). By decoding the three pages of block data, the three pages of block data may be combined with the top page of block page and written to the memory cells as part of the second stage of the programming operation.

In this way, systems and/or methods described efficiently and/or effectively program the set of memory cells. By programming the set of memory cells in the manner described above, the systems and/or methods decrease a number of SLC cache blocks needed to store data and minimize the transfer of data transfer within the memory device and/or between the memory device and a host device (e.g., relative to one or more conventional methods, such as the Foggy-Fine programming operation). Furthermore, the systems and/or methods cause a small Vth shift between the first and second stages (e.g., relative to a method described above, such as the MLC-Fine programming operation), thereby improving program performance and reducing neighbor word line interference (NWI) relative to that method.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a programming operation for one set of memory cells, wherein the one set of memory cells comprises memory cells assigned to represent one data state among a plurality of data states and memory cells assigned to represent another data state among the plurality of data states; the programming operation comprising a plurality of program-verify iterations; and in each program-verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program-verify iteration among the plurality of program-verify iterations in which to perform a verify test for the another data state for the memory cells assigned to represent the another data state.

Figure 1B:
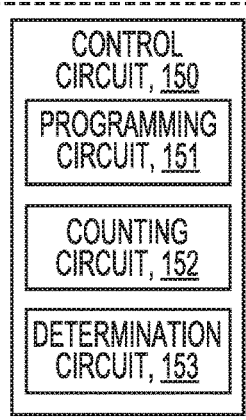
FIG. 1B illustrates a block diagram of an example control circuit which comprises a programming circuit, a counting circuit, and a determination circuit.

For example, FIG. 1B is a block diagram of an example control circuit 150 which comprises a programming circuit 151, a counting circuit 152 and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, non-volatile memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and non-volatile memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, non-volatile memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Figure 2:
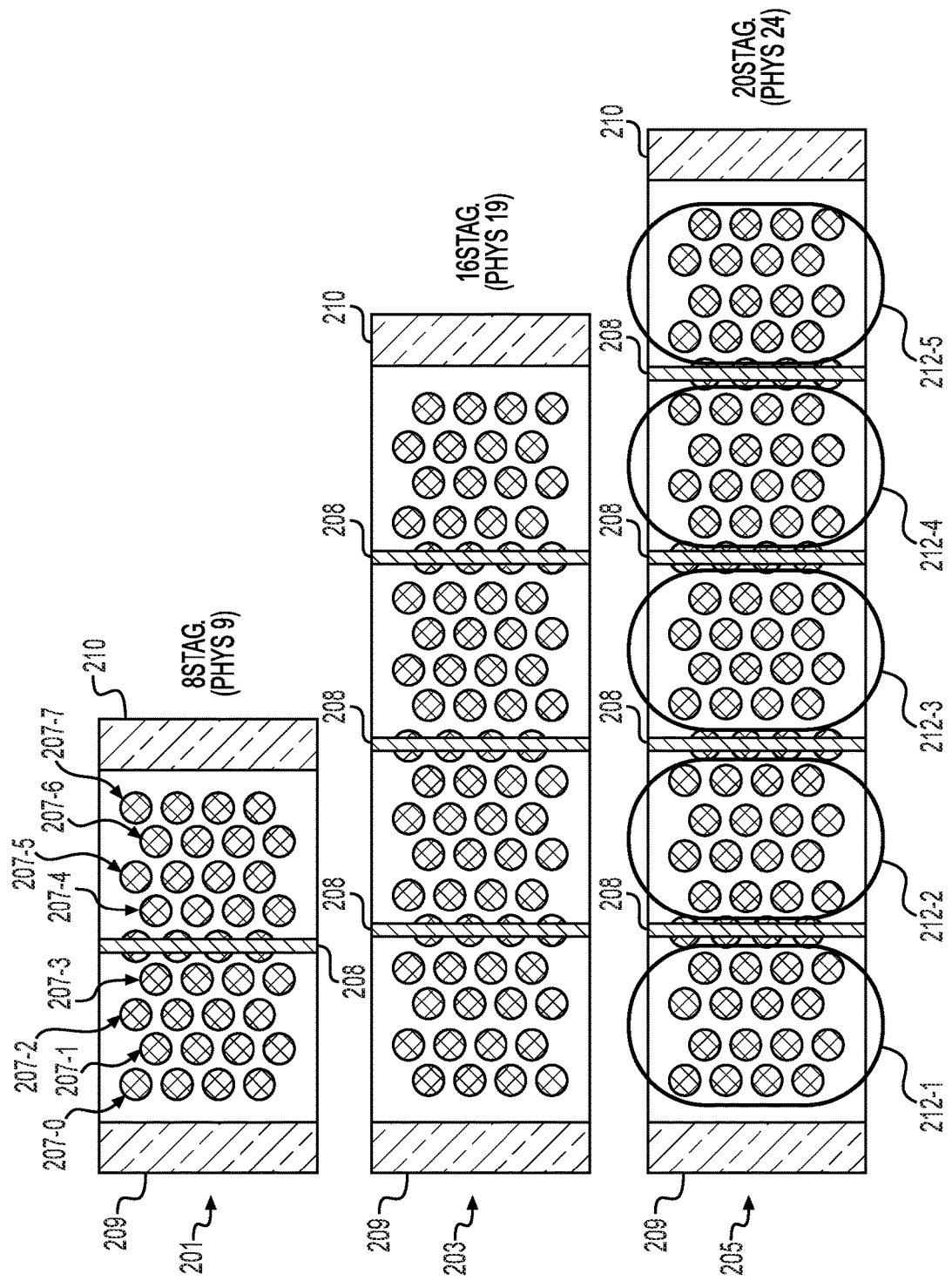
FIG. 2 illustrates a schematic view of three memory string architectures according to the principles of the present disclosure.

FIG. 2 illustrates a schematic view of example BiCS memory architectures utilizing staggered memory strings. For example, reference number 201 shows a schematic view of an example BiCS 4 memory architecture, reference number 203 shows a schematic view of an example BiCS 5 memory architecture, and reference number 205 shows a schematic view of an example BiCS 6 memory architecture. In some embodiments, as shown, a BiCS memory architecture may include an array of staggered NAND strings.

With reference to memory architecture 201, the memory strings are shown in rows 207-0 through 207-7 in string architecture 201. A memory string may include a set of memory cells (e.g., which correspond to a set of memory holes). Each row is shown with four ends to the memory strings. A memory string may be connected to an adjacent string at an end (not visible beneath this view). A first group of rows 207-0 through 207-3 of shown on a left side of a dummy row 208. A second group of rows 207-4 through 207-7 of shown on a right side of the dummy row 208. The dummy row 208 separates the two groups of rows in the staggered eight row. A source line 209 is positioned at an edge of the first group and is remote from the dummy row 208. A source line 210 is positioned at an edge of the second group and is remote from the dummy row 208 and source line 209.

The memory architectures 203 and 205 may be similar to that of string architecture 201 except additional groups are added. String architecture 203 may be double the size of architecture 201 and may include sixteen rows of strings with each group of four rows separated by a dummy row. String architecture 205 may be larger than both the memory architecture 201 and the memory architecture 203. String architecture 205 may include twenty rows of strings with each group of four rows separated by a dummy row 208.

In some embodiments, memory architectures 201, 203, and/or 205 may include a chip under array structure. For example, memory architectures 201, 203, and/or 205 may include a chip under array structure whereby the control circuitry is under the memory array that includes the groups of memory strings. With the chip under array structure, the memory strings may include a direct strap contact for the source line for read and erase operations.

In some embodiments, the memory architecture 205 may be a BiCS 6 memory architecture. For example, in a BiCS 6 memory architecture, there may be five NAND string groups. NAND string group 212-1, NAND string group 212-2, NAND string group 212-3, NAND string group 212-3, and NAND string group 212-4). NAND string group 212-0 and NAND string group 212-4 may be referred to as outer NAND string groups. NAND string group 212-1, NAND string group 212-2, and NAND string group 212-3 may be referred to collectively as inner NAND string groups. NAND string group 212-2 may be referred to as an inner-most NAND string group.

In some embodiments, the BiCS 6 memory architecture may be a 3-D memory architecture that includes one or more 3-D blocks. In this case, a 3-D block may be logically segmented into multiple sub-blocks corresponding to NAND string groups. The 3-D block may also be segmented into multiple planes. Additional block description is provided further herein.

While one or more embodiments refer to a BiCS memory architecture, it is to be understood that this is provided by way of example. In practice, the techniques described herein may be implemented on any number of different memory architectures, such as pipe-shaped BiCS (P-BiCS), a vertical recess array transistor (VRAT) architecture, and/or any other type of EEPROM or flash memory architecture.

Figure 3:
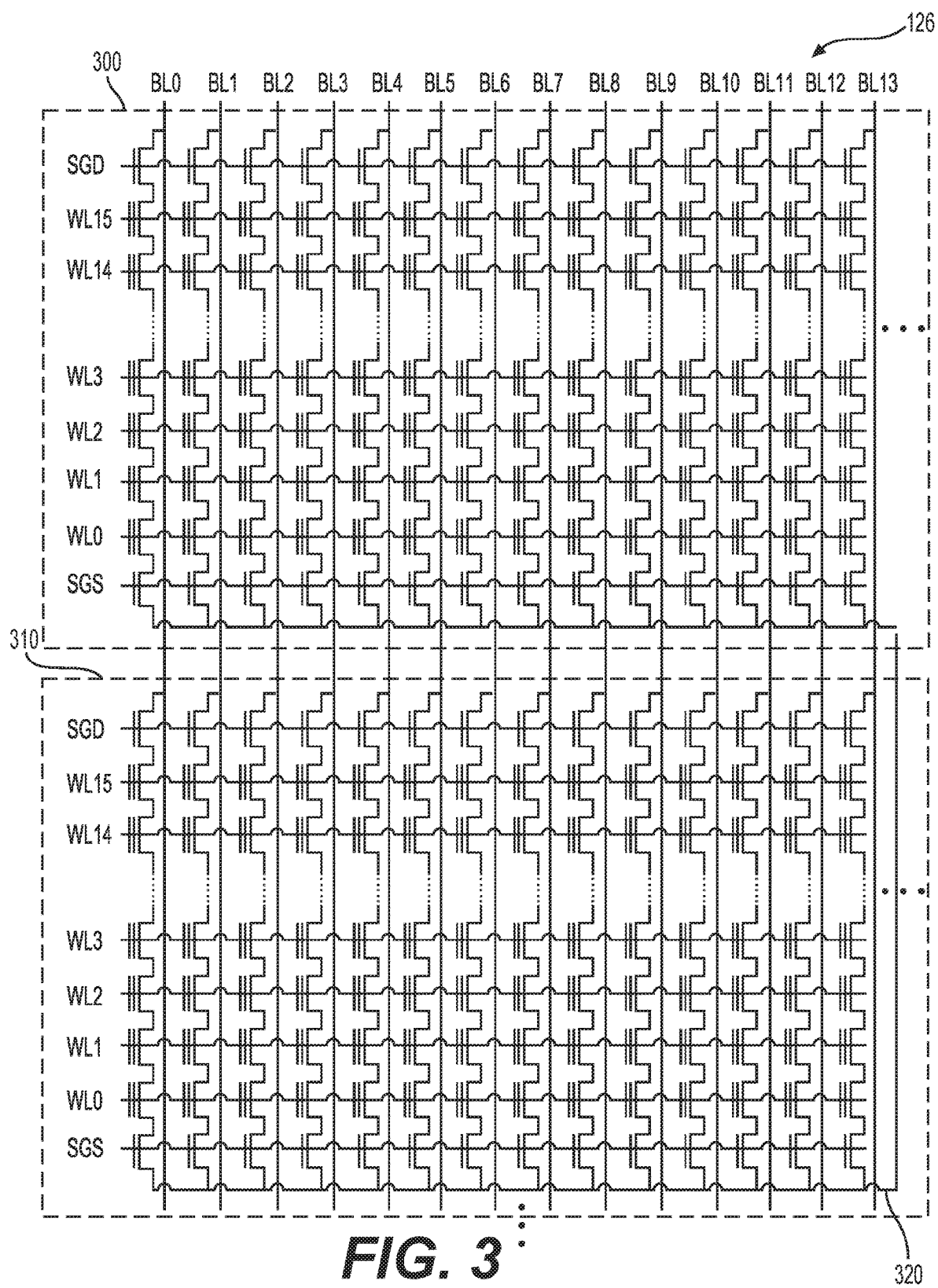
FIG. 3 illustrates blocks of memory cells in an example two-dimensional configuration of the memory array of FIG. 1.

FIG. 3 illustrates blocks of memory cells in an example two-dimensional configuration of the memory array 126 of FIG. 1. The memory array can include many blocks. Each example block 300, 310 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 320. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 4A and 4B. Other types of non-volatile memory can also be used. For example, a charge-trapping memory cell uses a non-conductive dielectric material in place of a conductive floating gate to store charge in a non-volatile manner. See FIGS. 5A and 5B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 4A:
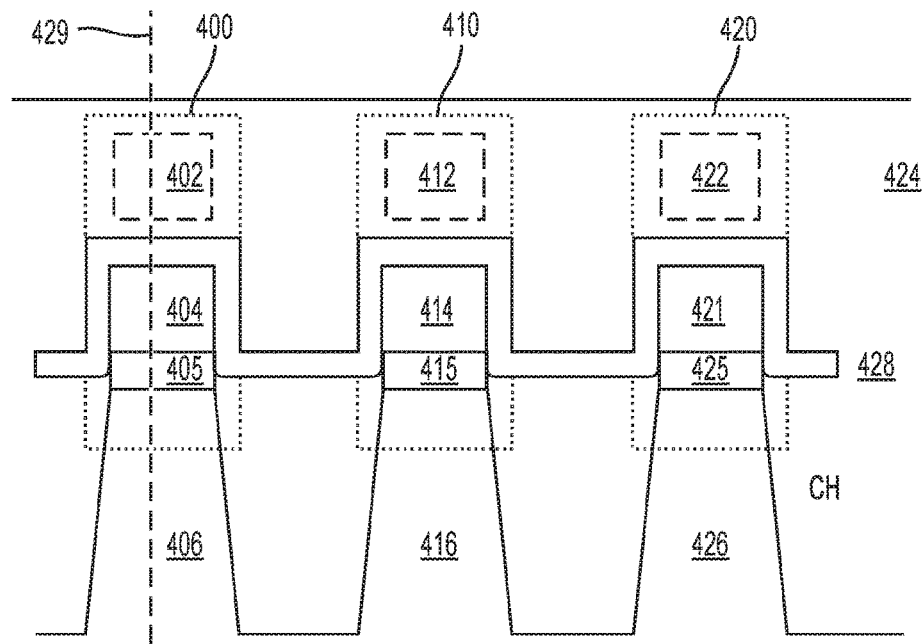
FIG. 4A illustrates a cross-sectional view of example floating gate memory cells in NAND strings.
Figure 4B:
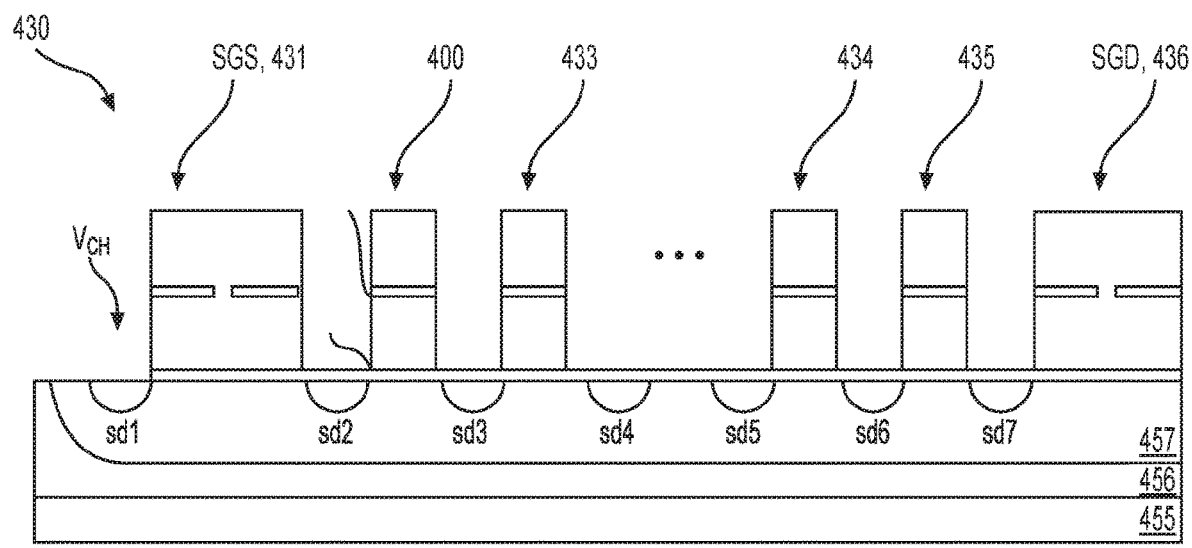
FIG. 4B illustrates a cross-sectional view of the structure of FIG. 4A along line 429.

FIG. 4A illustrates a cross-sectional view of example floating gate memory cells in NAND strings. A bit line or NAND string direction goes into the page, and a word line direction goes from left to right. As an example, word line 424 extends across NAND strings which include respective channel regions 406, 416 and 426. The memory cell 400 includes a control gate 402, a floating gate 404, a tunnel oxide layer 405 and the channel region 406. The memory cell 410 includes a control gate 412, a floating gate 414, a tunnel oxide layer 415 and the channel region 416. The memory cell 420 includes a control gate 422, a floating gate 421, a tunnel oxide layer 425 and the channel region 426. Each memory cell is in a different respective NAND string. An inter-poly dielectric (IPD) layer 428 is also illustrated. The control gates are portions of the word line. A cross-sectional view along contact line connector 429 is provided in FIG. 4B.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates.

Figure 5A:
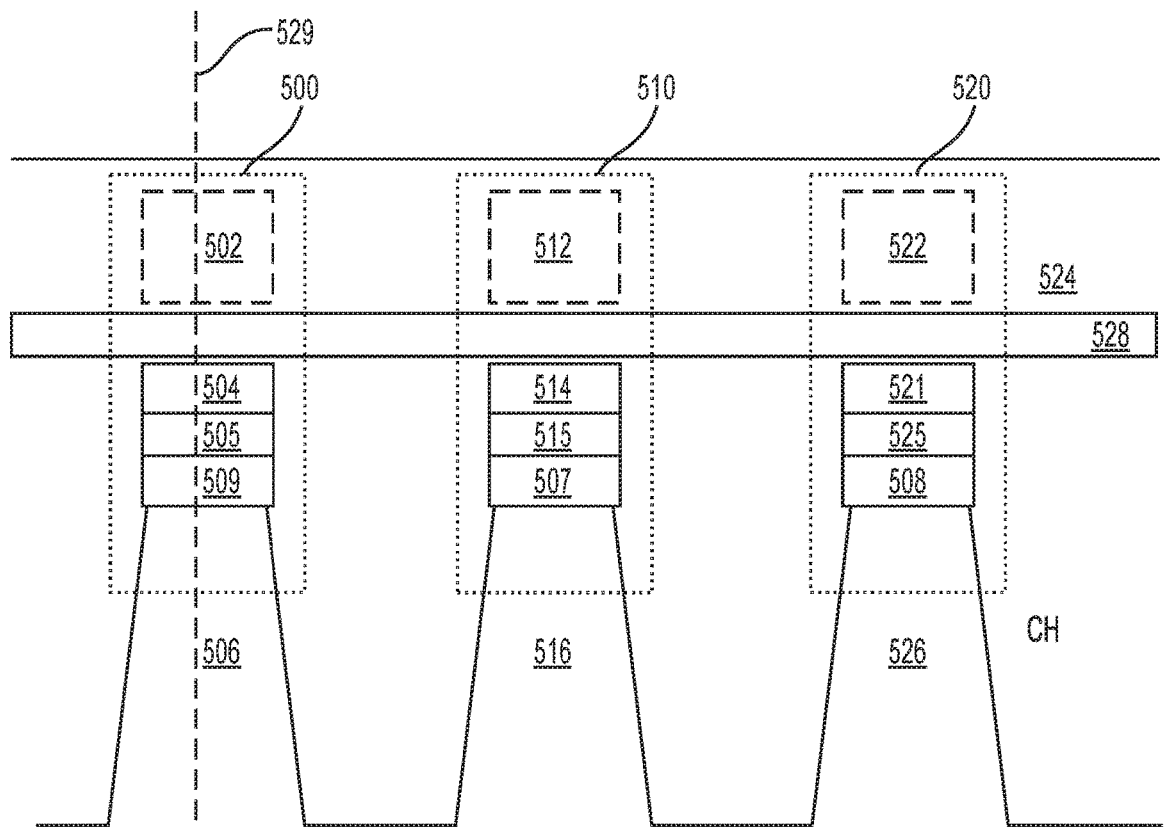
FIG. 5A illustrates a cross-sectional view of example charge-trapping memory cells in NAND strings.
Figure 5B:
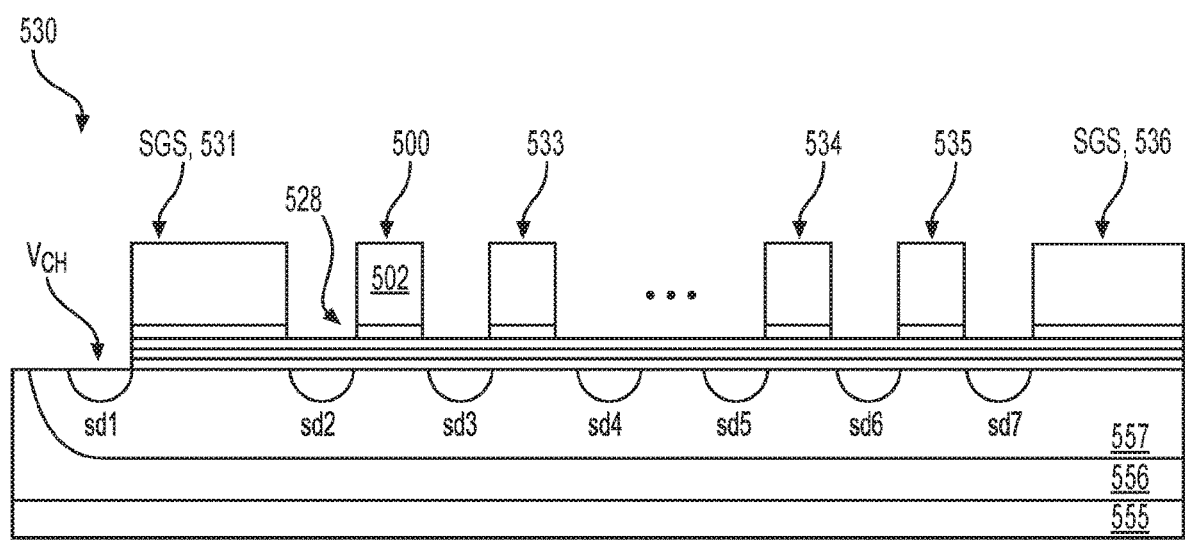
FIG. 5B illustrates a cross-sectional view of the structure of FIG. 5A along line 429.

As an alternative, as shown in FIGS. 5A and 5B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 5B illustrates a cross-sectional view of the structure of FIG. 5A along contact line connector 529. The NAND string 530 includes an SGS transistor 531, example memory cells 500, 533, . . . , 534 and 535, and an SGD transistor 536. The memory cell 400, as an example of each memory cell, includes the control gate 402, the IPD layer 428, the floating gate 404 and the tunnel oxide layer 505, consistent with FIG. 5A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well. A channel voltage, Vch, may be applied directly to the channel region of the substrate.

Figure 6A:
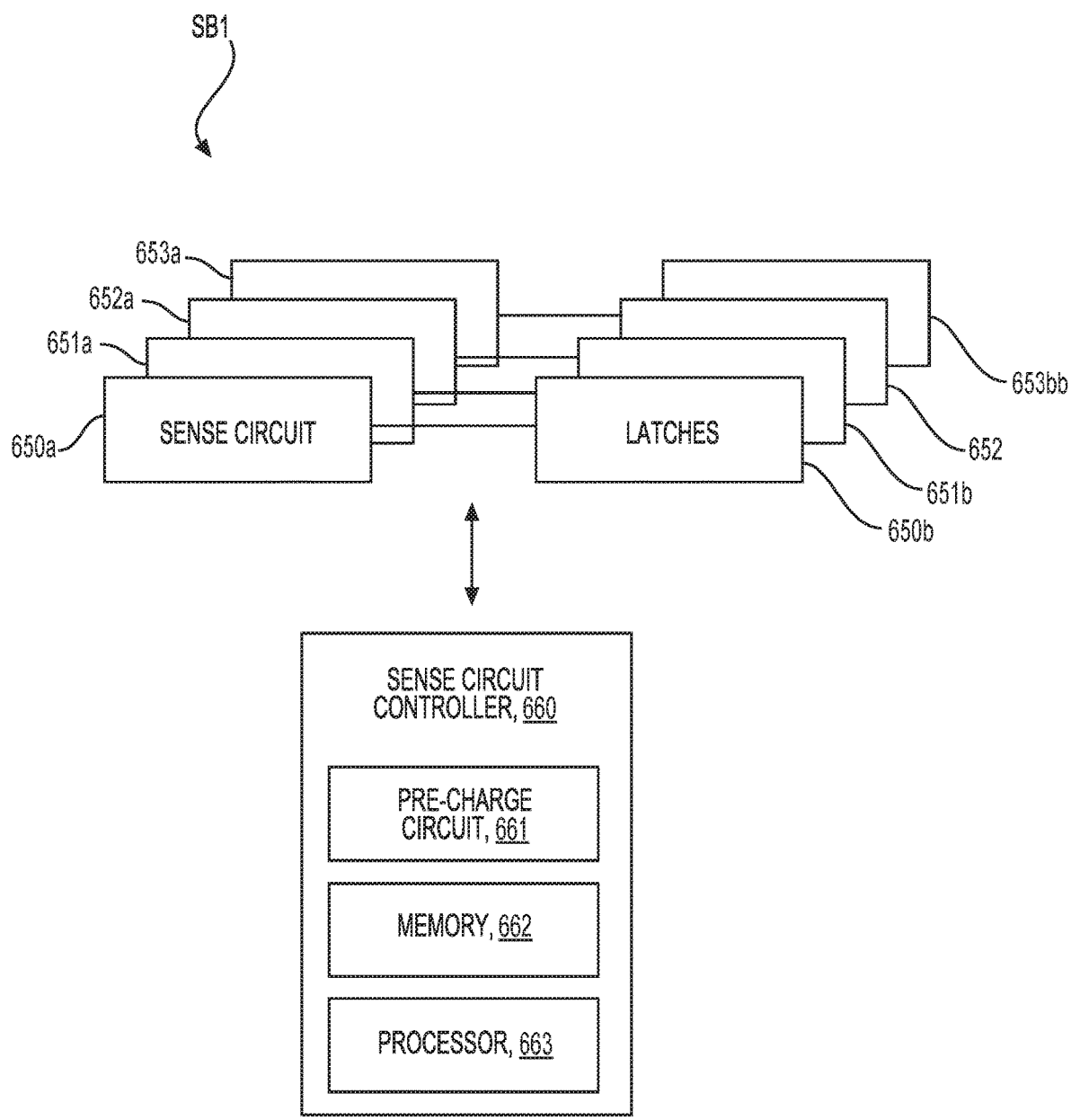
FIG. 6A illustrates an example block diagram of the sense block SB1 of FIG. 1.

FIG. 6A illustrates an example block diagram of the sense block SB1 of FIG. 1. In one approach, a sense block comprises multiple sense circuits. Each sense circuit is associated with data latches. For example, the example sense circuits 650a, 651a, 652a and 553a are associated with the data latches 650b, 551b, 652b and 653b, respectively. In one approach, different subsets of bit lines can be sensed using different respective sense blocks. This allows the processing load which is associated with the sense circuits to be divided up and handled by a respective processor in each sense block. For example, a sense circuit controller 660 in SB1 can communicate with the set of sense circuits and latches. The sense circuit controller may include a pre-charge circuit 661 which provides a voltage to each sense circuit for setting a pre-charge voltage. In one possible approach, the voltage is provided to each sense circuit independently, e.g., via the data bus 603 and a local bus such as LBUS1 or LBUS2 in FIG. 6B. In another possible approach, a common voltage is provided to each sense circuit concurrently, e.g., via the contact line 605 in FIG. 6B. The sense circuit controller may also include a memory 662 and a processor 663. The memory 662 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 650a and 651a are provided below.

The sense circuit controller can communicate with different sense circuits in a time-multiplexed manner, for instance. A contact line 605 may be connected to the voltage clamp in each sense circuit, in one approach.

The sense circuit 651a includes latches 651b, including a trip latch 646, an offset verify latch 647 and data state latches 648. A voltage clamp 641 may be used to set a pre-charge voltage at a sense node 642. A sense node to bit line (BL) switch 643 selectively allows the sense node to communicate with a bit line 645, and a voltage clamp 644 can set a voltage on the bit line. The bit line 645 is connected to one or more memory cells such as a memory cell MC2. A local bus, LBUS2, allows the sense circuit controller to communicate with components in the sense circuit, such as the latches 651b and the voltage clamp in some cases. To communicate with the sense circuit 651a, the sense circuit controller provides a voltage via a contact line 601 to a transistor 606 to connect LBUS2 with DBUS.

The sense circuit 650a may be a first sense circuit which comprises a first trip latch 626 and the sense circuit 651a may be a second sense circuit which comprises a second trip latch 646.

The sense circuit 650a is an example of a first sense circuit comprising a first sense node 622, where the first sense circuit is associated with a first memory cell MC1 and a first bit line 625. The sense circuit 651a is an example of a second sense circuit comprising a second sense node 642, where the second sense circuit is associated with a second memory cell MC2 and a second bit line 645.

Figure 6B:
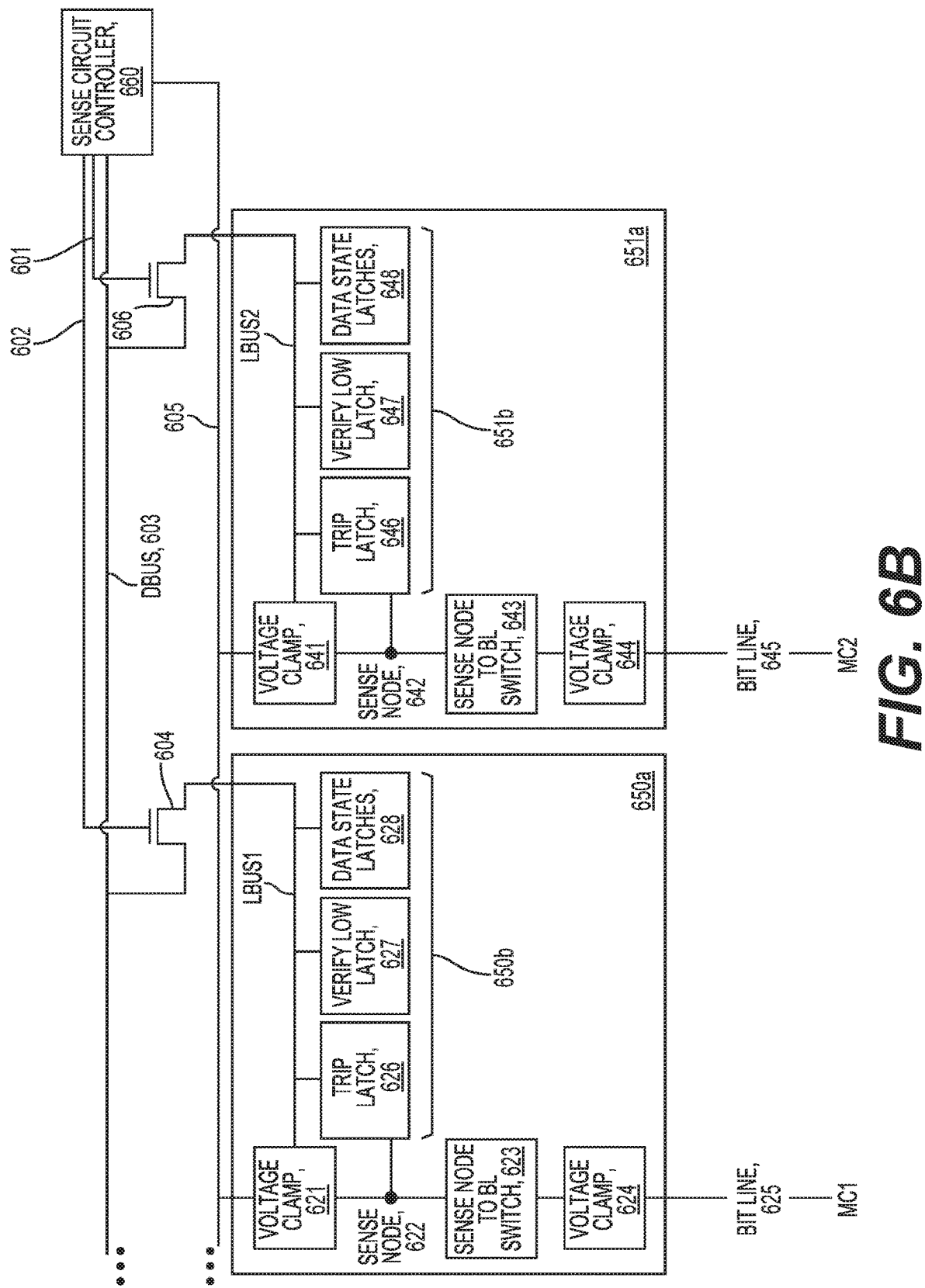
FIG. 6B illustrates another example block diagram of the sense block SB1 of FIG. 1.

FIG. 6B illustrates another example block diagram of the sense block SB1 of FIG. 1. The sense circuit controller 660 communicates with multiple sense circuits including example sense circuits 650a and 651a, also shown in FIG. 6A. The sense circuit 650a includes latches 650b, including a trip latch 626, an offset verify latch 627 and data state latches 628. The sense circuit further includes a voltage clamp 621 such as a transistor which sets a pre-charge voltage at a sense node 622. A sense node to bit line (BL) switch 623 selectively allows the sense node to communicate with a bit line 625, e.g., the sense node is electrically connected to the bit line so that the sense node voltage can decay. The bit line 625 is connected to one or more memory cells such as a memory cell MC1. A voltage clamp 624 can set a voltage on the bit line, such as during a sensing operation or during a program voltage. A local bus, LBUS1, allows the sense circuit controller to communicate with components in the sense circuit, such as the latches 650b and the voltage clamp in some cases. To communicate with the sense circuit 650a, the sense circuit controller provides a voltage via a contact line 602 to a transistor 604 to connect LBUS1 with a data bus DBUS 603. The communicating can include sending data to the sense circuit and/or receive data from the sense circuit.

Figure 7A:
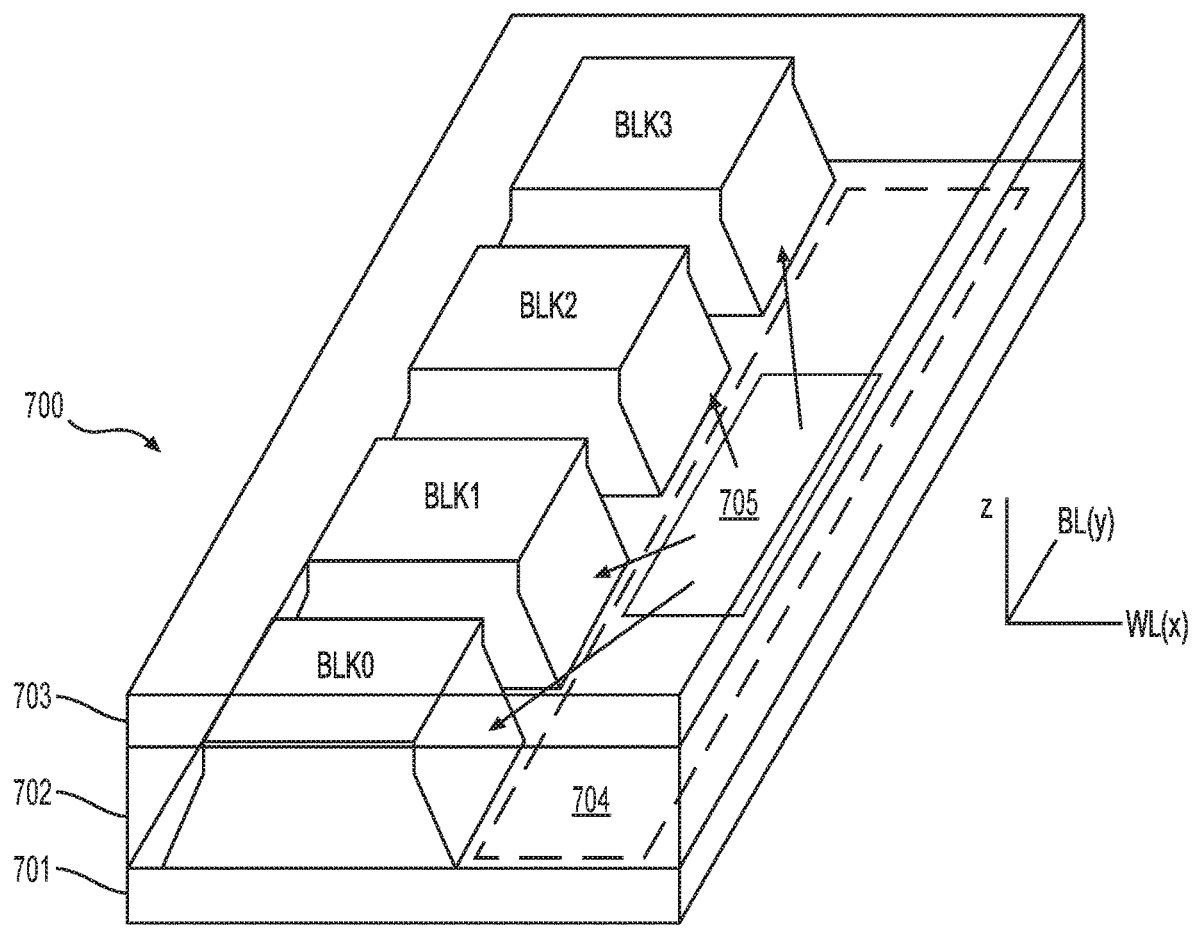
FIG. 7A illustrates a perspective view of a set of blocks in an example three-dimensional configuration of the memory array of FIG. 1.

FIG. 7A is a perspective view of a set of blocks 700 in an example three-dimensional configuration of the memory array 126 of FIG. 1. On the substrate are example blocks BLK0, BLK1, BLK2 and BLK3 of memory cells (storage elements) and a peripheral area 704 with circuitry for use by the blocks. For example, the circuitry can include voltage drivers 705 which can be connected to control gate layers of the blocks. In one approach, control gate layers at a common height in the blocks are commonly driven. The substrate 701 can also carry circuitry under the blocks, along with one or more lower metal layers which are patterned in conductive paths to carry signals of the circuitry. The blocks are formed in an intermediate region 702 of the memory device. In an upper region 703 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 7B:
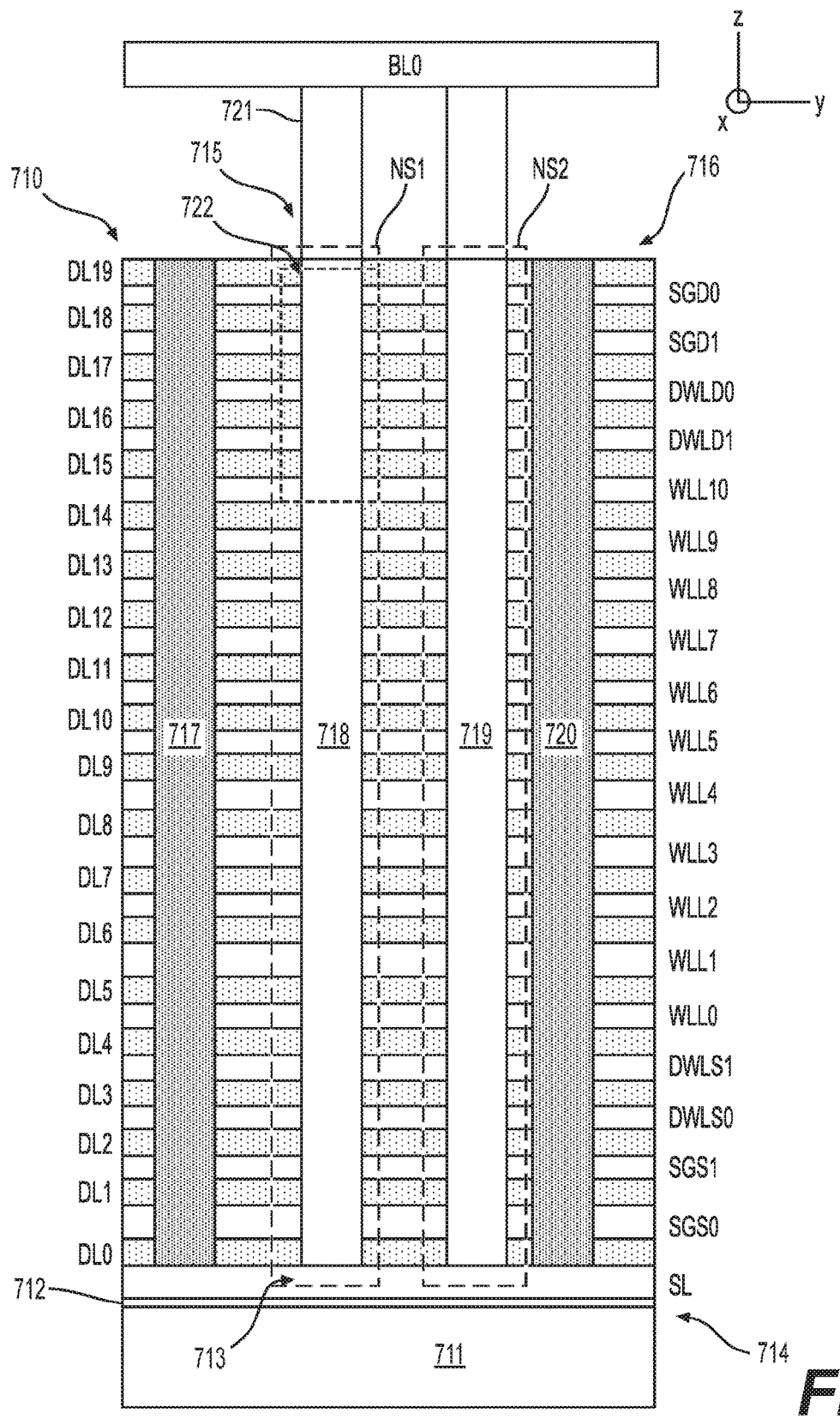
FIG. 7B illustrates an example cross-sectional view of a portion of one of the blocks of FIG. 7A.

FIG. 7B illustrates an example cross-sectional view of a portion of one of the blocks of FIG. 7A. The block comprises a stack 710 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are illustrated. Each NAND string encompasses a memory hole 718 or 719 which is filled with materials which form memory cells adjacent to the word lines. A region 722 of the stack is shown in greater detail in FIG. 7D.

The stack includes a substrate 711, an insulating film 712 on the substrate, and a portion of a source line SL. NS1 has a source-end 713 at a bottom 714 of the stack and a drain-end 715 at a top 716 of the stack. Contact line connectors (e.g., slits, such as metal-filled slits) 717 and 720 may be provided periodically across the stack as interconnects which extend through the stack, such as to connect the source line to a particular contact line above the stack. The contact line connectors may be used during the formation of the word lines and subsequently filled with metal. A portion of a bit line BL0 is also illustrated. A conductive via 721 connects the drain-end 715 to BL0.

Figure 7C:
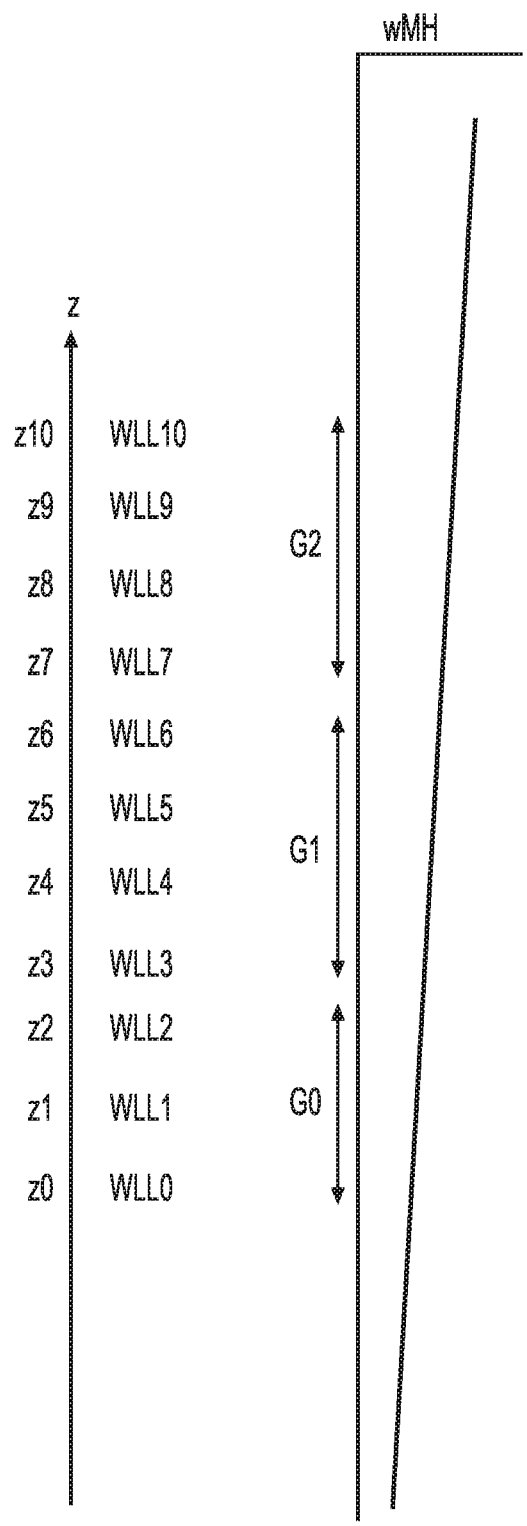
FIG. 7C illustrates a plot of memory hole diameter in the stack of FIG. 7B.

FIG. 7C illustrates a plot of memory hole diameter in the stack of FIG. 7B. The vertical axis is aligned with the stack of FIG. 7B and illustrates a width (wMH), e.g., diameter, of the memory holes 718 and 719. The word line layers WLL0-WLL10 of FIG. 7A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 7D:
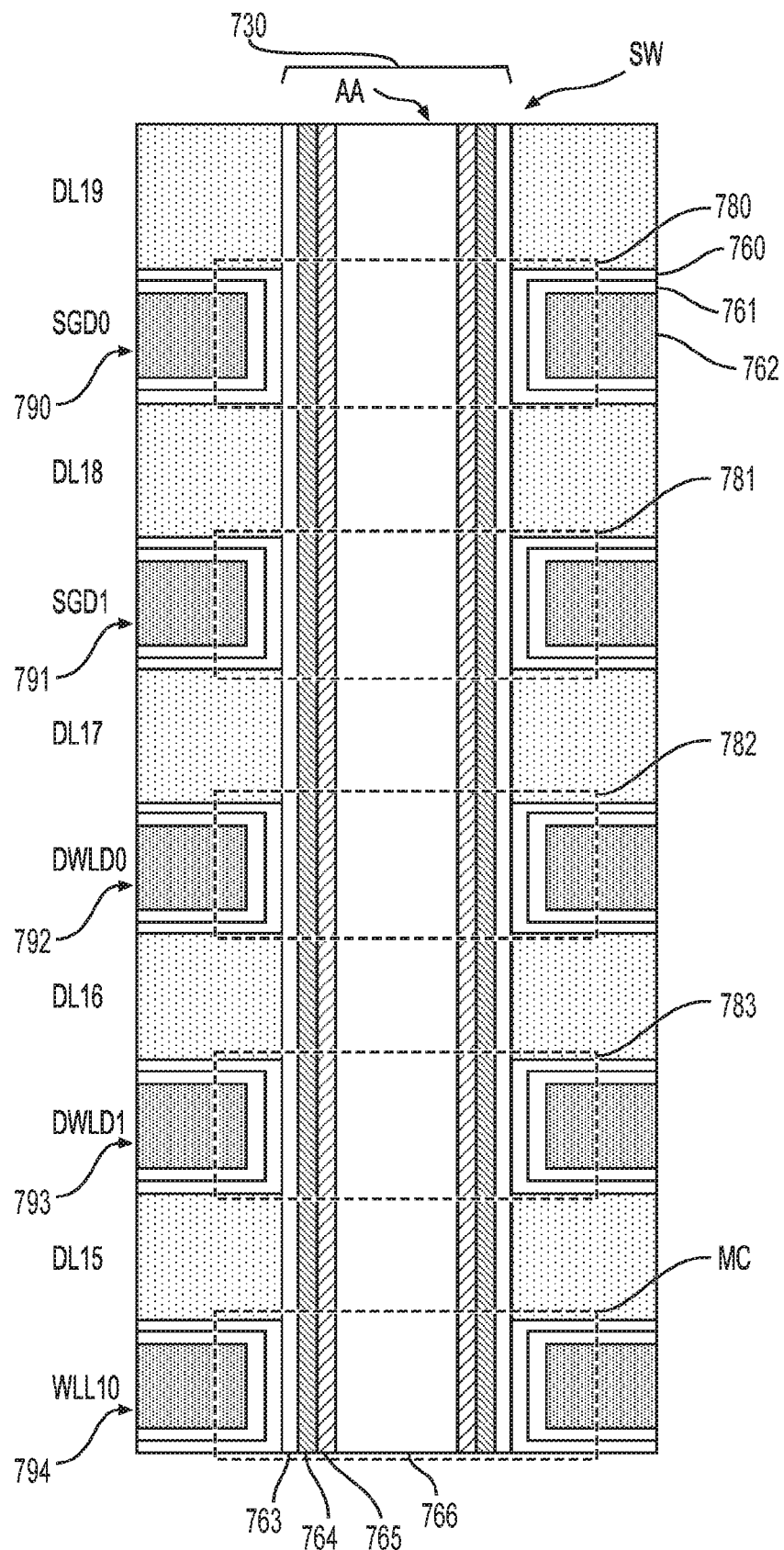
FIG. 7D illustrates a close-up view of the region 622 of the stack of FIG. 7B.

FIG. 7D illustrates a close-up view of the region 722 of the stack of FIG. 7B. Memory cells are formed at the different levels of the stack at the intersection of a word line layer and a memory hole. In this example, SGD transistors 780 and 781 are provided above dummy memory cells 782 and 783 and a data memory cell MC. A number of layers can be deposited along the sidewall (SW) of the memory hole 730 and/or within each word line layer, e.g., using atomic layer deposition. For example, each column (e.g., the pillar which is formed by the materials within a memory hole) can include a charge-trapping layer or film 763 such as SiN or other nitride, a tunneling layer 664, a polysilicon body or channel 765, and a dielectric core 766. A word line layer can include a blocking oxide/block high-k material 760, a metal barrier 761, and a conductive metal 762 such as Tungsten as a control gate. For example, control gates 790, 791, 792, 793 and 794 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 8A:
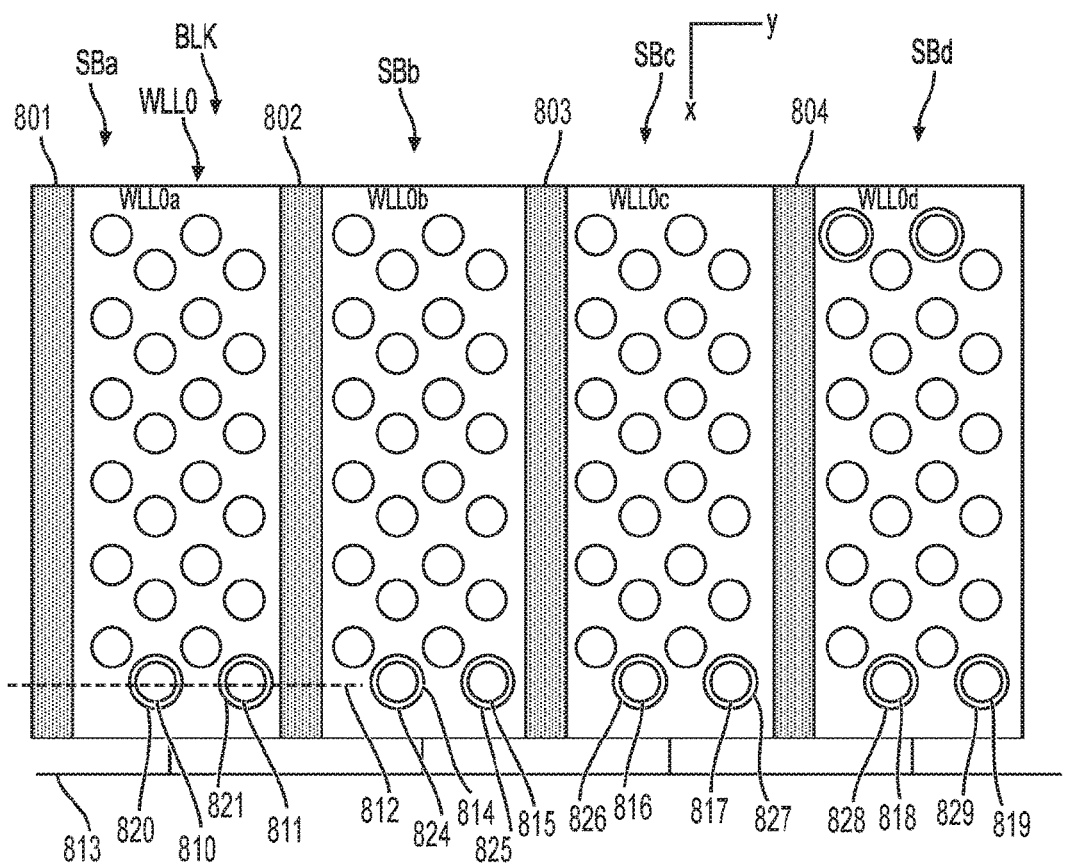
FIG. 8A illustrates a top view of an example word line layer WLL0 of the stack of FIG. 6B.

FIG. 8A illustrates a top view of an example word line layer WLL0 of the stack of FIG. 7B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 8B:
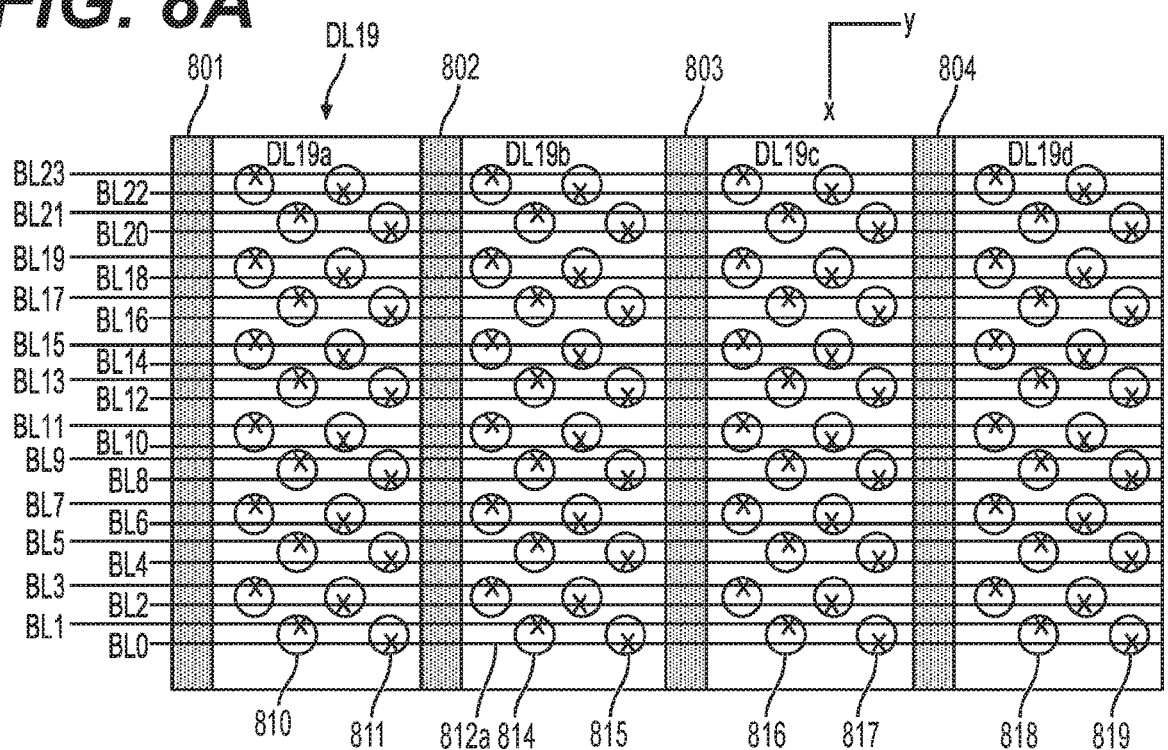
FIG. 8B illustrates a top view of an example top dielectric layer DL19 of the stack of FIG. 7B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WLL0 a, WLL0 b, WLL0 c and WLL0d which are each connected by a contact line 813. The last region of a word line layer in a block can be connected to a first region of a word line layer in a next block, in one approach. The contact line 813, in turn, is connected to a voltage driver for the word line layer. The region WLL0a has example memory holes 810 and 811 along a contact line 812. The region WLL0b has example memory holes 814 and 815. The region WLL0 c has example memory holes 816 and 817. The region WLL0 d has example memory holes 818 and 819. The memory holes are also shown in FIG. 8B. Each memory hole can be part of a respective NAND string. For example, the memory holes 810, 814, 816 and 818 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 820 and 821 are in WLL0a, memory cells 824 and 825 are in WLL0b, memory cells 826 and 827 are in WLL0c, and memory cells 828 and 829 are in WLL0d. These memory cells are at a common height in the stack.

Contact line connectors (e.g., slits, such as metal-filled slits) 801, 802, 803 and 804 may be located between and adjacent to the edges of the regions WLL0 a-WLL0 d. The contact line connectors provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 9A for further details of the sub-blocks SBa-SBd of FIG. 8A.

FIG. 8B illustrates a top view of an example top dielectric layer DL19 of the stack of FIG. 7B. The dielectric layer is divided into regions DL19 a, DL19 b, DL19 c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 810 and 811 along a contact line 812a which is coincident with a bit line BL0. A number of bit lines extend above the memory holes and are connected to the memory holes as indicated by the "X" symbols. BL0 is connected to a set of memory holes which includes the memory holes 811, 815, 817 and 819. Another example bit line BL1 is connected to a set of memory holes which includes the memory holes 810, 814, 816 and 818. The contact line connectors (e.g., slits, such as metal-filled slits) 801, 802, 803 and 804 from FIG. 8A are also illustrated, as they extend vertically through the stack. The bit lines can be numbered in a sequence BL0-BL23 across the DL19 layer in the −x direction.

Different subsets of bit lines are connected to memory cells in different rows. For example, BL0, BL4, BL8, BL12, BL16, and BL20 are connected to memory cells in a first row of cells at the right hand edge of each region. BL2, BL6, BL10, BL14, BL18, and BL22 are connected to memory cells in an adjacent row of cells, adjacent to the first row at the right hand edge. BL3, BL7, BL11, BL15, BL19, and BL23 are connected to memory cells in a first row of cells at the left hand edge of each region. BL1, BL5, BL9, BL13, BL17, and BL21 are connected to memory cells in an adjacent row of memory cells, adjacent to the first row at the left hand edge.

Figure 9A:
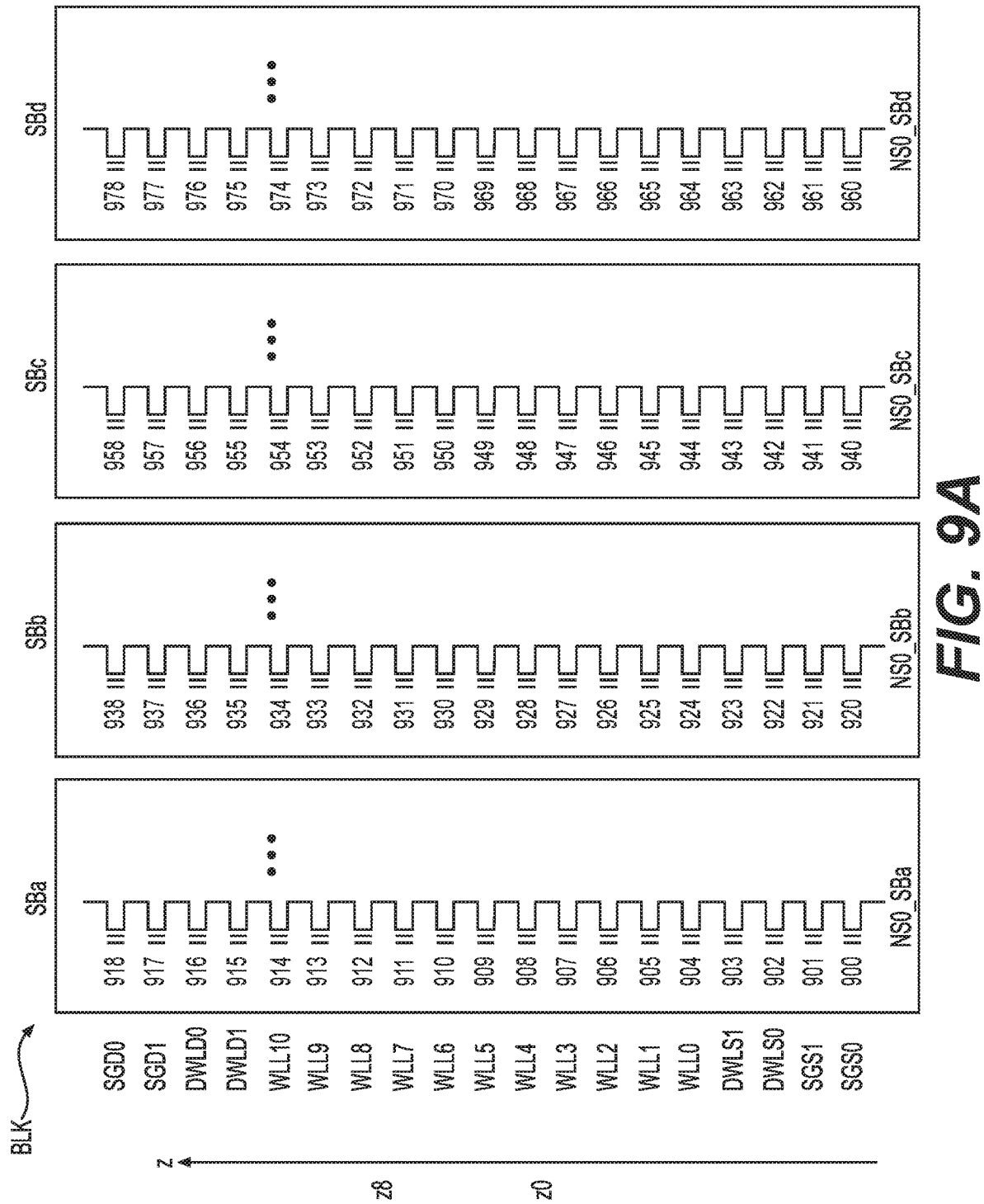
FIG. 9A illustrates example NAND strings in the sub-blocks SBa-SBd of FIG. 8A.

FIG. 9A illustrates example NAND strings in the sub-blocks SBa-SBe of FIG. 8A. The sub-blocks are consistent with the structure of FIG. 7B. The conductive layers in the stack are illustrated for reference at the left hand side. Each sub-block includes multiple NAND strings, where one example NAND string is illustrated. For example, SBa comprises an example NAND string NS0, SBb comprises an example NAND string NS1, SBc comprises an example NAND string NS2, SBd comprises an example NAND string NS3, and SBe comprises an example NAND string NS4.

Additionally, NS0_SBa include SGS transistors 900 and 901, dummy memory cells 902 and 903, data memory cells 904, 905, 906, 907, 908, 909, 910, 911, 912, 913 and 914, dummy memory cells 915 and 916, and SGD transistors 917 and 918.

NS1_SBb include SGS transistors 920 and 921, dummy memory cells 922 and 923, data memory cells 924, 925, 926, 927, 928, 929, 930, 931, 932, 933 and 934, dummy memory cells 935 and 936, and SGD transistors 937 and 938.

NS2_SBc include SGS transistors 940 and 941, dummy memory cells 942 and 843, data memory cells 944, 945, 946, 947, 948, 949, 950, 951, 952, 953 and 954, dummy memory cells 955 and 956, and SGD transistors 957 and 958.

NS3_SBd include SGS transistors 960 and 961, dummy memory cells 962 and 963, data memory cells 964, 965, 966, 967, 968, 969, 970, 971, 972, 973 and 974, dummy memory cells 975 and 976, and SGD transistors 977 and 978.

NS4_SBe include SGS transistors 980 and 981, dummy memory cells 982 and 983, data memory cells 984, 985, 986, 987, 988, 989, 980, 981, 982, 983 and 984, dummy memory cells 985 and 986, and SGD transistors 987 and 988.

At a given height in the block, memory cells in each sub-block are at a common height. For example, one set of memory cells (including the memory cell 904) is among a plurality of memory cells formed along tapered memory holes in a stack of alternating conductive and dielectric layers. The one set of memory cells is at a particular height z0 in the stack. Another set of memory cells (including the memory cell 924) connected to the one word line (WLL0) are also at the particular height. In another approach, another set of memory cells (e.g., including the memory cell 912) connected to another word line (e.g., WLL8) are at another height (z8) in the stack.

Figure 9B:
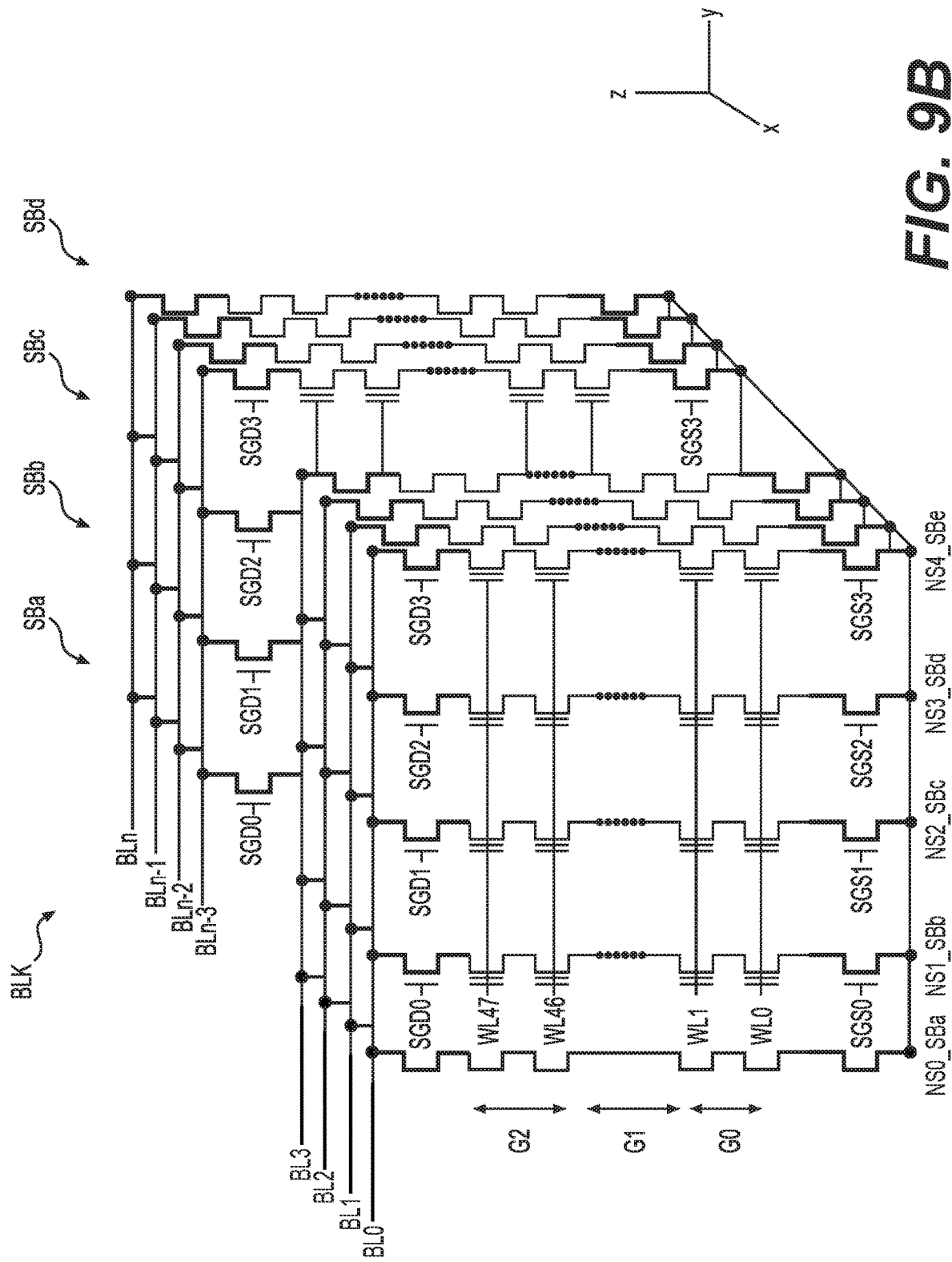
FIG. 9B illustrates another example view of NAND strings in sub-blocks.

FIG. 9B illustrates another example view of NAND strings in sub-blocks. The NAND strings include NS0_SBa, NS1_SBb, NS2_SBc, NS3_SBd, and NS4_SBe which have 48 word lines (e.g., WL0-WL47). Each sub-block comprises NAND string groups which extend in the x direction and which have a common SGD line, e.g., SGD0, SGD1, SGD2, SGD3, or SGD4. In this simplified example, there is only one SGD transistor and one SGS transistor in each NAND string. The NAND strings NS0_SBa, NS1_SBb, NS2_SBc, NS3_SBd, and NS4_SBe are in sub-blocks SBa, SBb, SBc, SBd, and SBe, respectively. Further, example, groups of word lines G0, G1 and G2 are illustrated.

Figure 10:
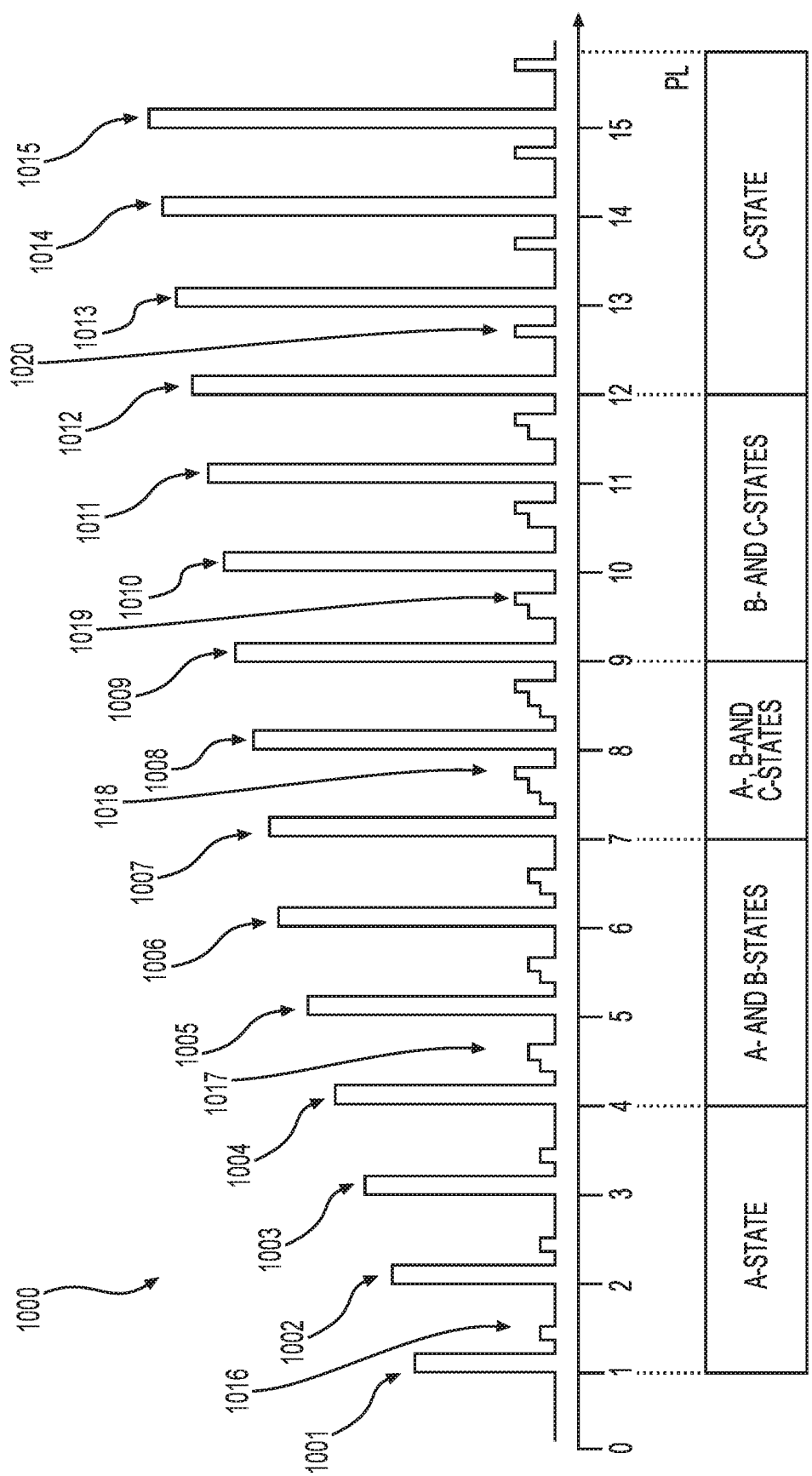
FIG. 10 illustrates the Vth distributions of memory cells in an example programming operation with at least four data states.

FIG. 10 illustrates a waveform of an example programming operation. The horizontal axis illustrates program loop numbers and the vertical axis illustrates program voltage values and program verify values. A program voltage (Vpgm) may include a word line voltage (WLVpgm) and/or a bit line voltage (BLVpgm). Generally, a programming operation may involve applying a pulse train to a selected word line, where the pulse train includes multiple program-verify (PV) iterations. The program portion of a PV iteration comprises the program voltage and the verify portion of the PV iteration comprises one or more verify voltages.

For each program voltage, a square waveform is illustrated for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming step in which the programming is completed. ISPP can also be used in each programming step of a multistep operation.

A pulse train typically includes program voltages which increase stepwise in amplitude in each program-verify iteration using a voltage bias (dVpgm). The voltage bias may, for example, be a word line voltage bias. A new pulse train may be applied in each programming step of a multistep program-verify operation, starting at an initial program voltage (e.g., an initial Vpgm) and ending at a final program voltage (e.g., a final Vpgm) which does not exceed a threshold voltage Vth (e.g., a maximum allowed value). The initial program voltages can be the same or different in different programming steps. The final program voltages can also be the same or different in different programming steps. The voltage biases may be the same or different in the different programming steps. In some cases, a smaller voltage bias is used in a final programming step to reduce Vth distribution widths.

The pulse train 1000 includes a series of program voltages 1001, 1002, 1003, 1004, 1005, 1006, 1007, 1008, 1009, 1010, 1011, 1012, 1013, 1014, and 1015 that are applied to a word line selected for programming, and an associated set of non-volatile memory cells. In the example shown, one, two, or three verify voltages are provided after each program voltage, for example, based on a number of target data states which are being verified. The number of target data states being verified may, for example, correspond to a number of memory cells associated with the word line. A program voltage and corresponding verify voltage can be separated by applying 0 V to the selected word line between the program voltage and the verify voltage.

In the example shown, an A-state verify voltage of VvA (e.g., waveform or programming signal 1016) may be applied after each of the first, second, and third program voltages 1001, 1002, and 1003, respectively. A- and B-state verify voltages of VvA and VvB (e.g., programming signal 1017) may be applied after each of the fourth, fifth and sixth program voltages 1004, 1005 and 1006, respectively. A-, B- and C-state verify voltages of VvA, VvB, and VvC (e.g., programming signal 1018) may be applied after each of the seventh and eighth program voltages 1007 and 1008, respectively. B- and C-state verify voltages of VvB and VvC (e.g., programming signal 1019) may be applied after each of the ninth, tenth and eleventh program voltages 1009, 1010, and 1011, respectively. Finally, a C-state verify voltage of VvC (e.g., programming signal 1020) may be applied after each of the twelfth, thirteenth, fourteenth and fifteenth program voltages 1012, 1013, 1014, and 1015, respectively.

In some embodiments, the memory device 100 (e.g., using the state machine 112 of the control circuitry 110, the controller 122, and/or the control circuit 150) may use different program voltages and/or different program voltage biases to perform the programming operation. In some embodiments, a program voltage and a program voltage bias used to perform the programming operation may include a word line voltage and a word line voltage bias, respectively. Additionally, or alternatively, the program voltage and the program voltage bias used to perform the programming operation may include a bit line voltage and a bit line voltage bias, respectively.

In some embodiments, a program voltage and/or a program voltage bias that is to be applied to a line (e.g., a bit line, a word line, etc.) connecting to a memory cell may be identified based on a position of the memory cell within the memory architecture. The position of the memory cell may be indicative of the memory cell being included in a particular NAND string group, indicative of the memory cell being included on a particular plane of the memory architecture, and/or the like. Additionally, or alternatively, the program voltage bias may be identified based on a thickness of contact line connectors that segment or separate a particular NAND string group (e.g., that the memory cell is included in) from other NAND string groups.

Figure 11:
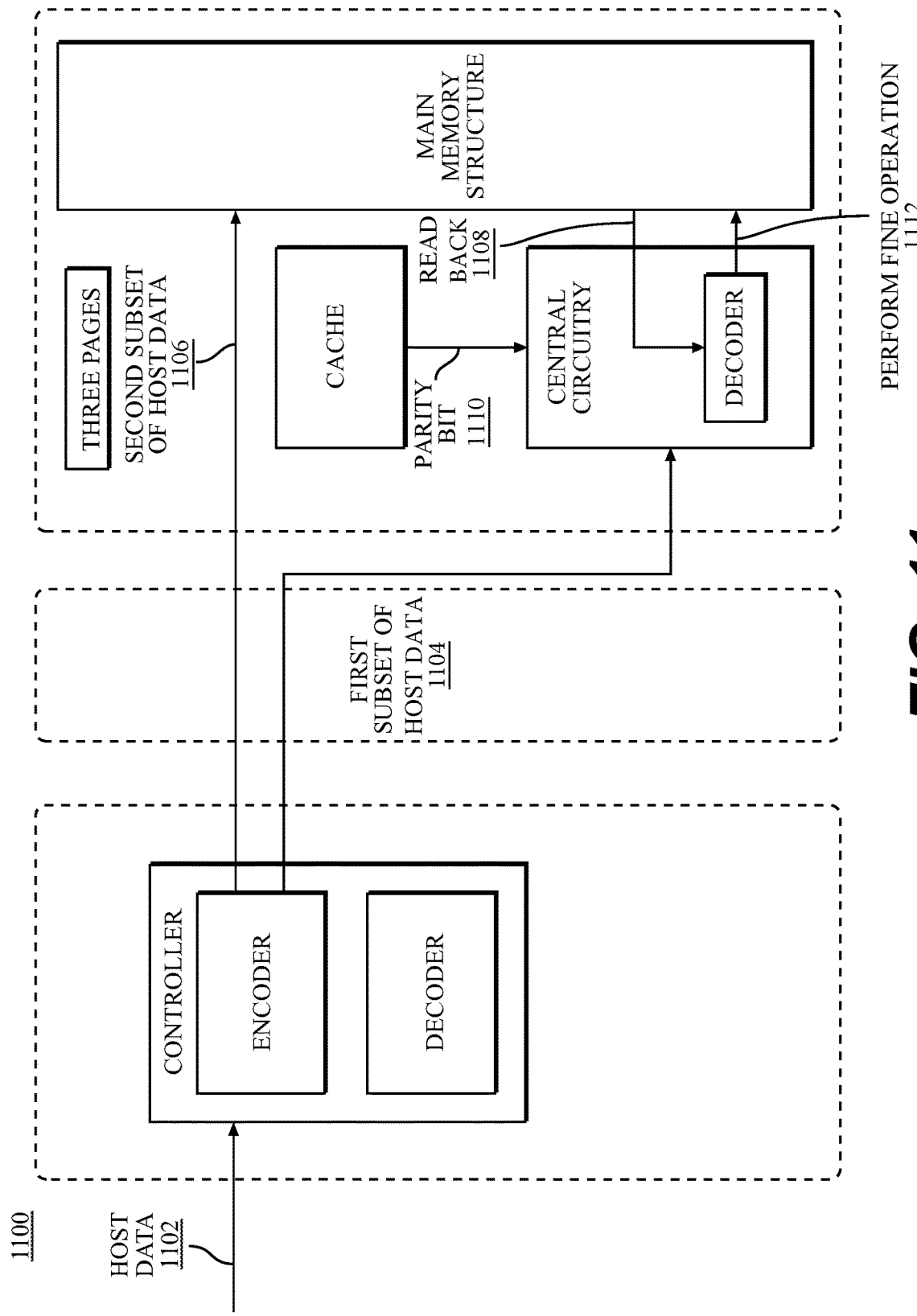
FIG. 11 illustrates schematically an application of a programming operation, according to the principles of the present disclosure.

FIG. 11 illustrates schematically an example application 1100 of an improved programming operation that is used to program memory cells. The memory cells may be supported by a memory device, such as the memory device 100. The memory device may include a memory, such as a NAND memory, a controller for communicating with a host device and the NAND memory, and a bus for sending communications to and/or receiving communications between the host device and the NAND memory. The controller may include a frequency modulator (FM), an encoder (e.g., a low-density parity-check (LDPC) encoder), a decoder (e.g., an LDPC decoder), and/or the like. The NAND memory may include a cache (e.g., an SLC cache), control circuitry, read/write circuits (not shown), and a main memory structure that supports the memory cells. The memory cells may include QLCs, TLCs, SLCs, and/or the like. The control circuitry of the NAND memory may communicate with a frequency modulator (FM) device via a bus or other communication interface.

While one or more embodiments refer to a NAND memory, it is to be understood that this is provided by way of example. In practice, the one or more embodiments may be implemented on any number of different types of non-volatile memory. Additionally, while one or more embodiments are described as being implemented by the controller, it is to be understood that this is provided by way of example, and that in practice, the one or more embodiments may be implemented by the control circuitry. Furthermore, while one or more embodiments are described as being implemented by the control circuitry, it is to be understood that this is provided by way of example, and that in practice, the one or more embodiments may be implemented by the controller.

As shown by reference number 1102, the controller may receive host data from the host device. For example, the controller (e.g., using the encoder, such as a low-density parity-check (LDPC) encoder) may receive host data from the host device. The host device may, for example, provide the controller with the host data when running an application under a file system or operating system.

In some embodiments, the memory cells may be TLCs and may utilize full sequence programming. In this case, one word line may be programmed completely before moving on to programming another word line.

In some embodiments, the host data may include pages of block data to be used when programming the memory cells. A page may include block data relating to a group of memory cells (often along a word line or bit line) that are to be programmed together as a unit. The block data of the page may include user data, header data relating to error correction code (ECC) and/or flags, and/or the like. For example, the block data may include a string of binary numbers that address data in units of logical sectors where, for example, each sector may contain 512 bytes of data. The block data may, for example, identify storage locations of specific blocks in which memory cells are located. The addressed data may be referred to as logical addresses. In some embodiments, the block data may include binary numbers that address data in units of logical clusters, each consisting of one or more logical sectors.

In some embodiments, four pages of block data may be used, such as an upper page, a middle page, a lower page, and a top page. Naming conventions for these four pages may vary but ultimately refer to the same four logical pages. For example, in some situations, the top page may be referred to as a fourth page or as a last page.

In some embodiments, the controller may store the host data using a data structure. For example, the controller may store the host data using a data structure supported by static random access memory (SRAM), dynamic RAM (DRAM), and/or another type of memory.

In some embodiments, the controller may encapsulate the host data. For example, the controller (e.g., using the encoder) may encapsulate the host data using error correction code (ECC) data.

In some embodiments, the controller may process the host data or the host data (e.g., encapsulated host data) to identify a first subset of host data to be programmed to the memory cells. The first subset may include a top page of block data to be programmed to the memory cells. In some embodiments, the controller may process the host data to identify a second subset of host data to be programmed to the memory cells. The second set of host data may include the first three pages of block data to be programmed to the memory cells. As will be described further herein, the first three pages of block data may be programmed during a first stage of the programming operation and the top page of block data may be programmed with the first three pages during a second stage of the programming operation.

As shown by reference number 1104, the controller may provide the first subset of host data to the control circuitry. For example, the controller may provide, via the bus, the first subset of host data to the decoder of the control circuitry. This will allow the top page of block data to be combined with the other three pages of block data during a final stage of the programming operation, as will be described further herein.

As shown by reference number 1106, the controller may provide the second subset of host data to the main memory structure. For example, the controller (e.g., using the encoder) may perform a TLC stage of the programming operation by providing, via the bus, the second set of host data to the NAND memory. As described, the second set of host data may include the three pages of block data (e.g., the upper page, the middle page, and the lower page).

In some embodiments, a 3345 coding scheme may be implemented when performing the first stage of the programming operation. For example, a 3345 coding scheme or structurally similar coding scheme may be implemented such that three pages are used to program eight TLC data states. This allows for larger spacing between each Vth, thereby improving Vth margin and program reliability.

In some embodiments, performing the TLC stage may include programming memory cells based on the three pages of block data. For example, the three pages of block data may be programmed such that the block data of the three pages is written as eight TLC data states.

As shown by reference number 1108, programmed data states may be read back to the control circuitry. For example, the control circuitry may perform a read operation to read the programmed data states from respective memory cells. In some embodiments, the parity bit may be generated within the NAND memory and stored using the cache. This allowed the parity bit to be provided to the control circuitry and used for decoding the second set of host data, as will be described further herein. As shown by reference number 1110, a parity bit may be stored using a cache (e.g., an SLC cache) and the parity bit may be provided to the control circuitry of the NAND memory. In some embodiments, the control circuitry may perform a read operation to read the parity bit from the cache.

As shown by reference number 1112, the control circuitry may decode the second set of host data and may combine the decoded second set of host data with the first set of host data. For example, the control circuitry (e.g., using the decoder) may perform a Fine stage of the programming operation by using the parity bit to decode the three pages of block data (i.e., the second subset of the host data), such that the parity bit may be used to distinguish between odd and even data states.

In some embodiments, the control circuitry may, as part of the Fine stage, use the parity bit to program the eight data states into sixteen data states that have tighter Vth width. For example, if data states programmed during a TLC stage of the programming operation are state 0, state 1, state 4, state 5, state 6, state 10, state 12, and state 14 (e.g., eight of the sixteen QLC data states), then the parity bit may be used to distinguish between state 0 and state 1, state 1 and state 4, state 4 and state 5, state 5 and state 6, and so forth. Additional information regarding decoding block data is provided in connection with FIG. 10.

By programming eight data states in the first stage, the memory device reduces NWI relative to an MLC-Fine programming operation. This is because of a smaller Vth shift between the first and second stages. Additionally, by utilizing the parity bit, only the parity bit has to be stored in cache memory, thereby conserving resources (e.g., memory resources, computing resources, and/or network resources) relative to one or more conventional solutions that have to store pages of block data in cache. Furthermore, the four pages of block data only has to be provided to the NAND memory one time, thereby reducing the data transfer load on one or more components of the memory device.

Figure 12:
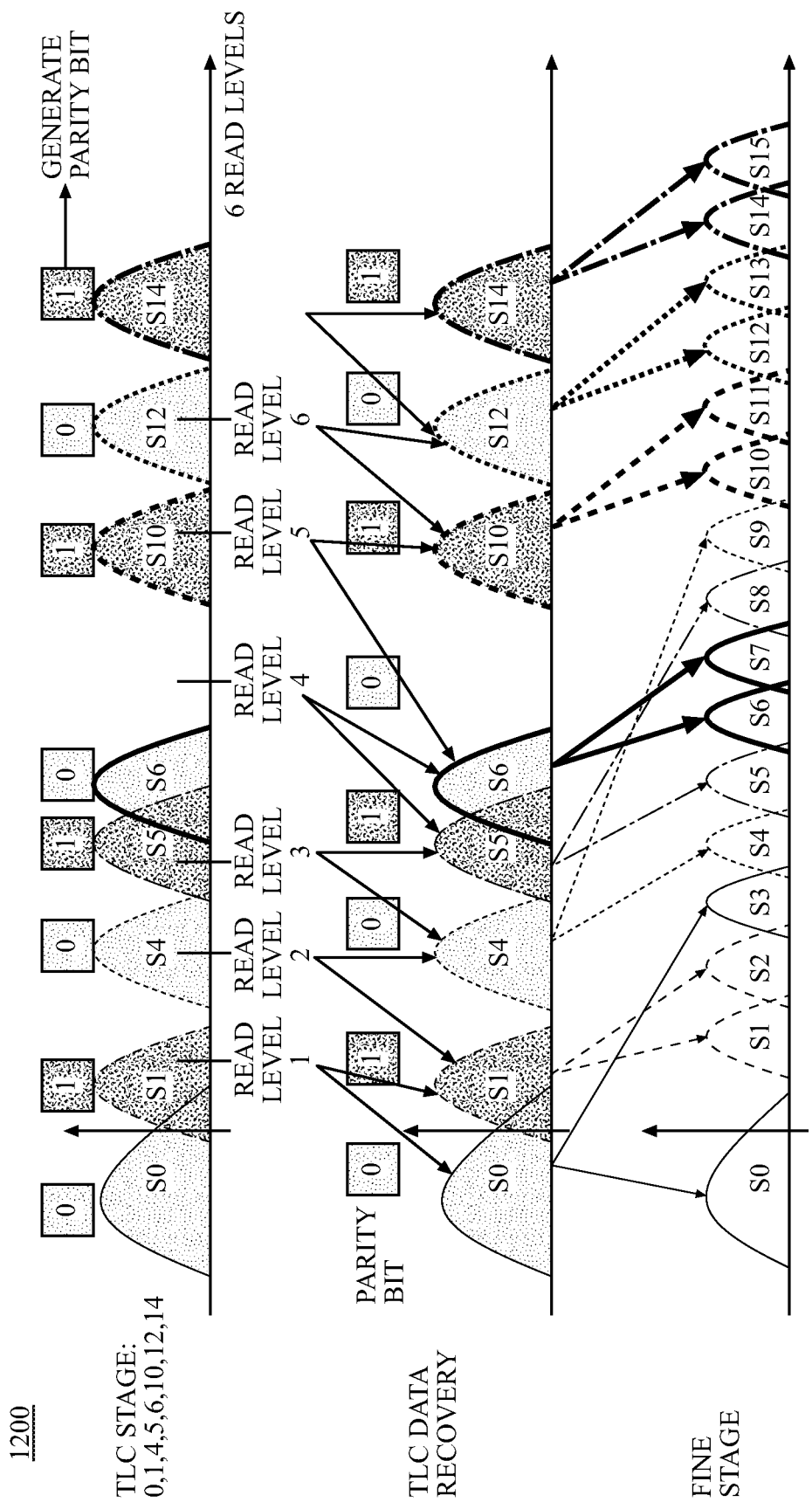
FIG. 12 illustrates graphically a set of threshold voltage distributions (Vths) for 3-bit memory cells at various stages of a programming operation, according to the principles of the present disclosure.

FIG. 12 illustrates graphically a set of threshold voltage distributions (Vths) for 3-bit memory cells at various stages of a programming operation, according to the principles of the present disclosure. As shown by the top line, a first stage of the programming operation may cause memory cells to be programmed into eight data states (e.g., shown as data state s0, data state s1, data state s4, data state s5, data state s6, data state s10, data state s12, and data state s14). A parity bit may be generated and stored in an SLC cache of one or more of the memory cells. In the example shown, parity bits 0, 1, 0, 1, 0, 1, 0, 1 may correspond to data state s0, data state s1, data state s4, data state s5, data state s6, data state s10, data state s12, and data state s14. As will be described, the parity bits allow the control circuitry to distinguish between odd and even data states. In some embodiments, the eight memory cells may be programmed using a set of read levels (shown as read level 1, read level 2, . . . , read level 6). For example, each read level may correspond to a parity bit value that may identify one of two possible data states to select.

In some embodiments, a second programming stage (shown as a Fine stage) may be performed as shown by the middle line and the bottom line. For example, to decode the data states, a recovery operation may be performed that identifies a parity bit between two read levels and determines a data state corresponding to the parity bit based on which read levels that the parity bit is positioned between. This may continue until the programming operation is complete.

In this way, the programming operation may be used to efficiently and effectively program the memory cells.

Figure 13:
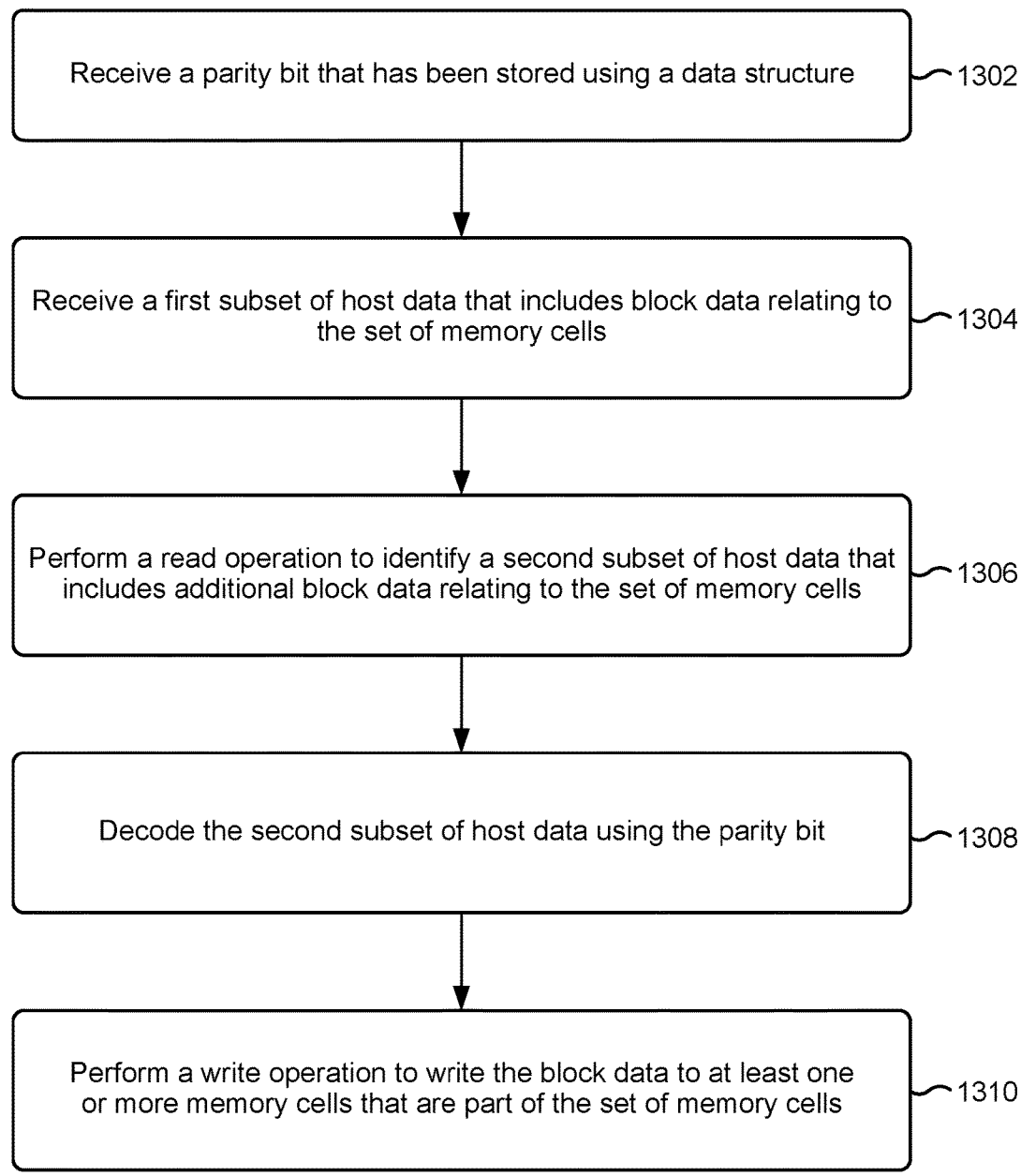
FIG. 13 is a flow diagram illustrating an example method for programming a set of memory cells.

FIG. 13 is a flow diagram illustrating an example method for programming a set of memory cells. Step 1302 receives a parity bit that has been stored using a data structure. For example, a control circuitry of a non-volatile memory (e.g., a NAND memory), may receive a parity bit that has been stored using a data structure (e.g., an SLC cache). Step 1304 receives a first subset of host data that includes block data relating to the set of memory cells. For example, the control circuitry of the NAND memory may receive the first subset of host data that includes block data relating to the set of memory cells. In some embodiments, the host data may be for a top page of block data relating to the set of memory cells.

Step 1306 performs a read operation to identify a second subset of host data that includes additional block data relating to the set of memory cells. For example, the control circuitry may perform a read operation (or may cause a read operation to be performed) in order to identify a second subset of host data that includes additional block data relating to the set of memory cells. In some embodiments, the second subset of host data may be for three other pages of additional block data, which may include an upper page, a middle page, and a lower page.

Step 1308 decodes the second subset of host data using the parity bit. For example, the control circuitry may use the parity bit to decode the second subset of host data. This may allow the control circuitry to distinguish between odd and even data states, such that the control circuitry can re-program the eight data states into sixteen data states, as described in connection with step 1310.

In some embodiments, the control circuitry may combine the first subset of host data and the second subset of host data. For example, because the three other pages have been decoded, the control circuitry may combine the three other pages with the top page, such that all four pages may be written to the NAND memory.

Step 1310 performs a write operation to write the block data and the additional block data to at least one or more memory cells that are part of the set of memory cells. In some embodiments, the control circuitry may perform a write operation to write the block data and the additional block data to at least one or more memory cells that are part of the set of memory cells. For example, the control circuitry may perform a write operation to write the combined four pages of block data to at least one or more memory cells of the set of memory cells.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

The foregoing detailed description of the invention has been presented for purposes of illustration and description.

It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in may be directly on the other layer of substrate, or intervening layers may also be present. Further, it will be understood that when a layer is referred to as being "under" another layer, it may be directly under, and one or more intervening layers may also be present. Furthermore, when a layer is referred to as "between" two layers, it may be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

What is claimed is:

1. A non-volatile memory device, comprising:
a memory; and
control circuitry, communicatively coupled to the memory, wherein the control circuitry is for programming a set of memory cells and is configured to:
receive a parity bit that has been stored using a data structure;
receive a first subset of host data that includes block data relating to the set of memory cells;
perform a read operation to identify a second subset of host data that includes additional block data relating to the set of memory cells;
decode the second subset of host data using the parity bit; and
perform a write operation to write the block data and the additional block data to at least one or more memory cells that are part of the set of memory cells.

2. The non-volatile memory device as set forth in claim 1, wherein the parity bit allows the control circuitry to differentiate between particular data states.

3. The non-volatile memory device as set forth in claim 1, wherein the parity bit allows the control circuitry to differentiate between data state n and data state n+1.

4. The non-volatile memory device as set forth in claim 3, wherein a first bit corresponding to data state n overlaps with a second bit corresponding to data state n+1.

5. The non-volatile memory device as set forth in claim 1, wherein the control circuitry is further configured to:
combine the top page of block data and the three other pages of additional block data that has been decoded, wherein the top page is capable of being combined with the three other pages based on the parity bit being used to decode the three other pages.

6. The non-volatile memory device as set forth in claim 1, wherein the set of memory cells are quad-level cells (QLCs).

7. The non-volatile memory device as set forth in claim 1, wherein the one or more memory cells are programmed to eight data states during the first stage of the programming operation.

8. A method of performing a programming operation to program a set of memory cells, wherein performing the programming operation comprises:
receiving a parity bit that has been stored using a data structure;
receiving a first subset of host data that includes block data relating to the set of memory cells;
performing a read operation to identify a second subset of host data that includes additional block data relating to the set of memory cells;
decoding the second subset of host data using the parity bit; and
performing a write operation to write the block data and the additional block data to at least one or more memory cells that are part of the set of memory cells.

9. The method as set forth in claim 8, wherein the first subset of host data includes a top page of block data, and wherein the second subset of host data includes three other pages of additional block data.

10. The method as set forth in claim 9, further comprising:
combining the top page of block data and the three other pages of additional block data that has been decoded, wherein the top page is capable of being combined with the three other pages based on the parity bit being used to decode the three other pages.

11. The method as set forth in claim 8, wherein the parity bit allows the control circuitry to differentiate between data state n and data state n+1.

12. The method as set forth in claim 11, wherein a first bit corresponding to data state n overlaps with a second bit corresponding to data state n+1.

13. The method as set forth in claim 8, wherein the control circuitry is further configured to:
cause the parity bit to be stored using a single-level cell (SLC) cache.

14. A device, comprising:
control circuitry, communicatively coupled to a non-volatile memory, said control circuitry for programming a set of memory cells, wherein the control circuitry, when programming the set of memory cells, is configured to:
receive a parity bit that has been stored using a data structure;
receive a first subset of host data that includes block data for a top page, wherein the block data relating to the set of memory cells;
perform a read operation to identify a second subset of host data that includes three other pages of additional block data relating to the set of memory cells;
decode the second subset of host data using the parity bit; and
perform a write operation to write the top page of block data and the three other pages of the additional block data that has been decoded to at least one or more memory cells that are part of the set of memory cells.

15. The device as set forth in claim 14, wherein the parity bit allows the control circuitry to differentiate between particular data states.

16. The device as set forth in claim 15, wherein the parity bit allows the control circuitry to differentiate between data state n and data state n+1.

17. The device as set forth in claim 15, wherein the control circuitry is further configured to:
  cause the parity bit to be stored using a single-level cell (SLC) cache.

18. The device as set forth in claim 15, wherein the one or more memory cells are programmed to eight data states during a first stage of a programming operation, and wherein the control circuitry, when performing the write operation, is configured to:
  perform the write operation to program the one or more memory cells to sixteen data states, wherein the write operation is part of a second stage of the programming operation.

19. The device as set forth in claim 15, wherein the control circuitry is further configured to:
  combine the top page of block data and the three other pages of the additional block data that has been decoded, wherein the top page is capable of being combined with the three other pages based on the parity bit being used to decode the three other pages.

20. The device as set forth in claim 15, wherein the memory cells are triple-level cells (TLCs).

* * * * *